(12) United States Patent
Chen et al.

(10) Patent No.: US 12,506,089 B2
(45) Date of Patent: Dec. 23, 2025

(54) SEMICONDUCTOR STRUCTURES WITH IMPROVED RELIABILITY

(71) Applicant: Taiwan Semiconductor Manufacturing Company, Ltd., Hsin-Chu (TW)

(72) Inventors: Kuei-Ming Chen, New Taipei (TW); Chi-Ming Chen, Hsinchu County (TW); Shih-Pang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 747 days.

(21) Appl. No.: 17/831,714

(22) Filed: Jun. 3, 2022

(65) Prior Publication Data
US 2023/0395531 A1   Dec. 7, 2023

(51) Int. Cl.
| | | |
|---|---|---|
| H01L 23/00 | (2006.01) | |
| H01L 21/768 | (2006.01) | |
| H01L 23/31 | (2006.01) | |
| H01L 23/48 | (2006.01) | |
| H01L 23/58 | (2006.01) | |

(Continued)

(52) U.S. Cl.
CPC ...... *H01L 23/562* (2013.01); *H01L 21/76898* (2013.01); *H01L 23/3171* (2013.01); *H01L 23/481* (2013.01); *H01L 23/564* (2013.01); *H01L 23/585* (2013.01); *H10D 30/015* (2025.01); *H10D 30/475* (2025.01);

(Continued)

(58) Field of Classification Search
CPC ............. H01L 23/564; H01L 21/76898; H01L 23/3171; H01L 23/481; H01L 23/562; H01L 23/585; H10D 30/015; H10D 30/475; H10D 62/8503; H10D 84/01; H10D 84/05; H10D 64/254; H10D 84/82
See application file for complete search history.

(56) References Cited

U.S. PATENT DOCUMENTS 7,906,836 B2 * 3/2011 Chen ...................... H01L 21/78
257/E21.523
8,168,529 B2 * 5/2012 Lin ...................... H01L 25/0657
438/622

(Continued)

FOREIGN PATENT DOCUMENTS

TW        202046504 A      12/2020

*Primary Examiner* — Eduardo A Rodela
(74) *Attorney, Agent, or Firm* — HAYNES AND BOONE, LLP

(57) ABSTRACT

Semiconductor structures and methods are provided. An exemplary semiconductor structure according to the present disclosure includes a semiconductor substrate including a first region and a second region surrounding the first region, a III-V semiconductor layer disposed directly over the first region, a compound semiconductor device formed in and over the III-V semiconductor layer, a first plurality of conductive features disposed over and electrically coupled to a source contact of the compound semiconductor device, and a seal ring disposed directly over the second region and comprising a second plurality of conductive features, a top surface of a topmost conductive feature of the first plurality of conductive features is higher than a top surface of a topmost conductive feature of the second plurality of conductive features.

20 Claims, 21 Drawing Sheets

(51) Int. Cl.
*H10D 30/01* (2025.01)
*H10D 30/47* (2025.01)
*H10D 62/85* (2025.01)
*H10D 84/01* (2025.01)
*H10D 84/05* (2025.01)

(52) U.S. Cl.
CPC ......... *H10D 62/8503* (2025.01); *H10D 84/01* (2025.01); *H10D 84/05* (2025.01)

(56) References Cited

U.S. PATENT DOCUMENTS

| | | | |
|---|---|---|---|
| 8,742,547 B2 * | 6/2014 | Yoshizawa | H01L 23/562 |
| | | | 257/E21.705 |
| 9,275,935 B2 * | 3/2016 | Kitao | H01L 23/53238 |
| 10,546,802 B2 * | 1/2020 | Sekikawa | H01L 21/764 |
| 11,133,266 B2 * | 9/2021 | Ding | H01L 25/18 |
| 11,682,632 B2 * | 6/2023 | Paul | H01L 23/552 |
| | | | 257/620 |
| 2007/0032059 A1 * | 2/2007 | Hedler | H01L 21/76898 |
| | | | 257/E21.597 |
| 2008/0061397 A1 * | 3/2008 | Uchida | H01L 23/564 |
| | | | 257/508 |
| 2010/0314727 A1 * | 12/2010 | Uchida | H01L 24/05 |
| | | | 257/659 |
| 2018/0012770 A1 * | 1/2018 | Macelwee | H01L 23/3185 |
| 2020/0111707 A1 | 4/2020 | Wei et al. | |
| 2022/0059460 A1 * | 2/2022 | Do | H01L 23/485 |

* cited by examiner

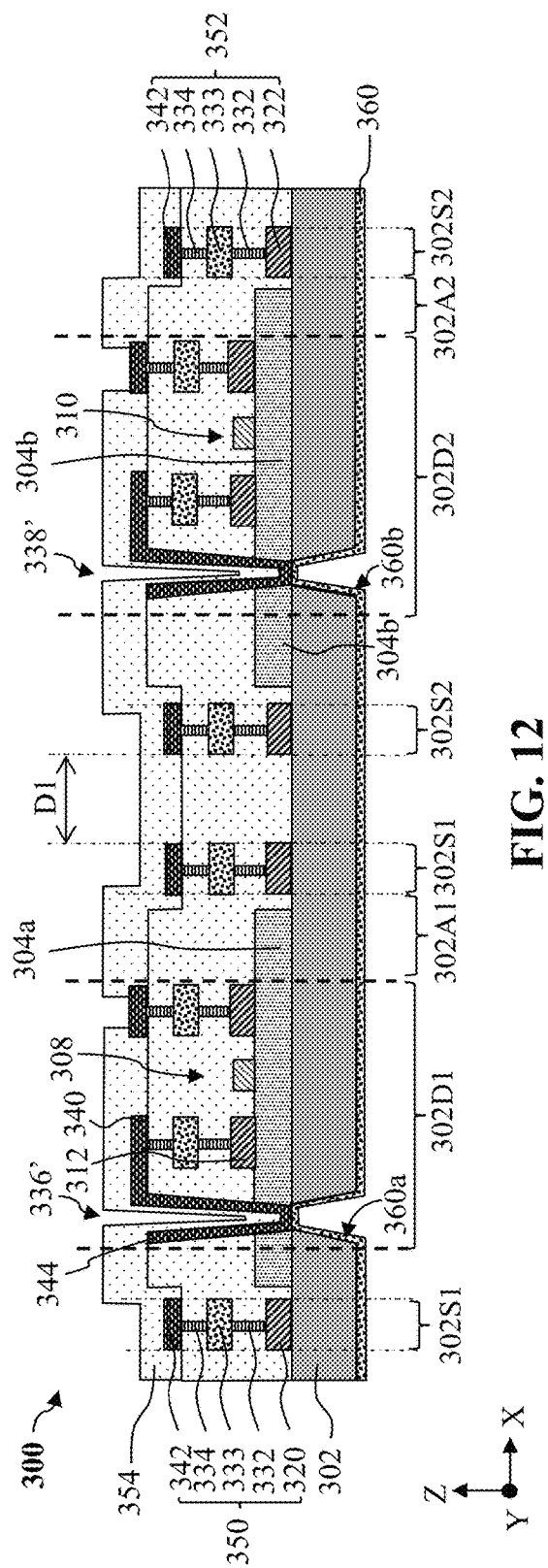
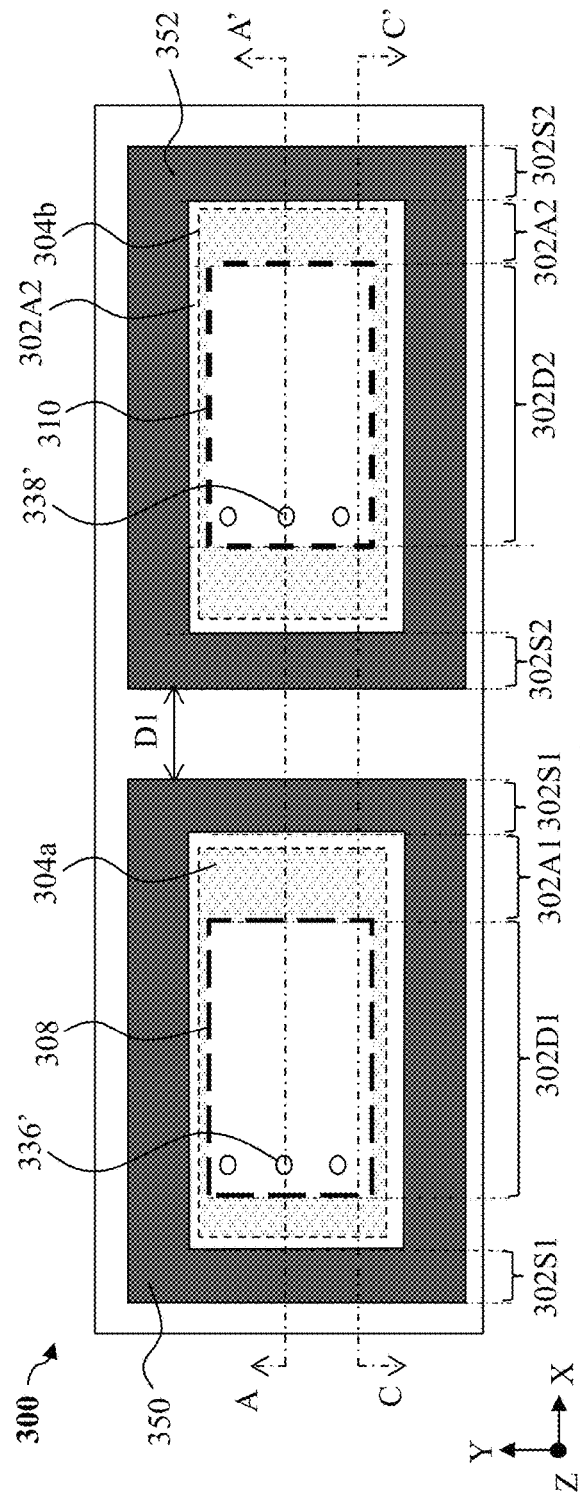
FIG. 12
FIG. 13

SEMICONDUCTOR STRUCTURES WITH IMPROVED RELIABILITY

BACKGROUND

In semiconductor technology, Group III-Group V (or III-V) semiconductor compounds may be used to form various semiconductor devices, such as high-power field-effect transistors (FETs), high frequency transistors, or high-electron-mobility transistors (HEMTs). A HEMT is a transistor having a two-dimensional electron gas (2-DEG) layer close to a junction between two materials with different bandgaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies.

To protect semiconductor devices from, for example, moisture degradation, ionic contamination, and dicing processes, a seal ring may be formed around the semiconductor devices. This seal ring may be formed during fabrication of a multi-layer structure that includes semiconductor devices and interconnect structures that route electrical signals among the semiconductor devices. While existing semiconductor structures that include the semiconductor devices and seal rings are generally adequate in for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, and 12 illustrate fragmentary cross-sectional views of a workpiece during various fabrication stages in the method of FIG. 2, according to various aspects of the present disclosure.

FIG. 13 illustrates a fragmentary top view of the workpiece shown in FIG. 12, according to various embodiments of the present disclosure.

DETAILED DESCRIPTION

Figure 1:
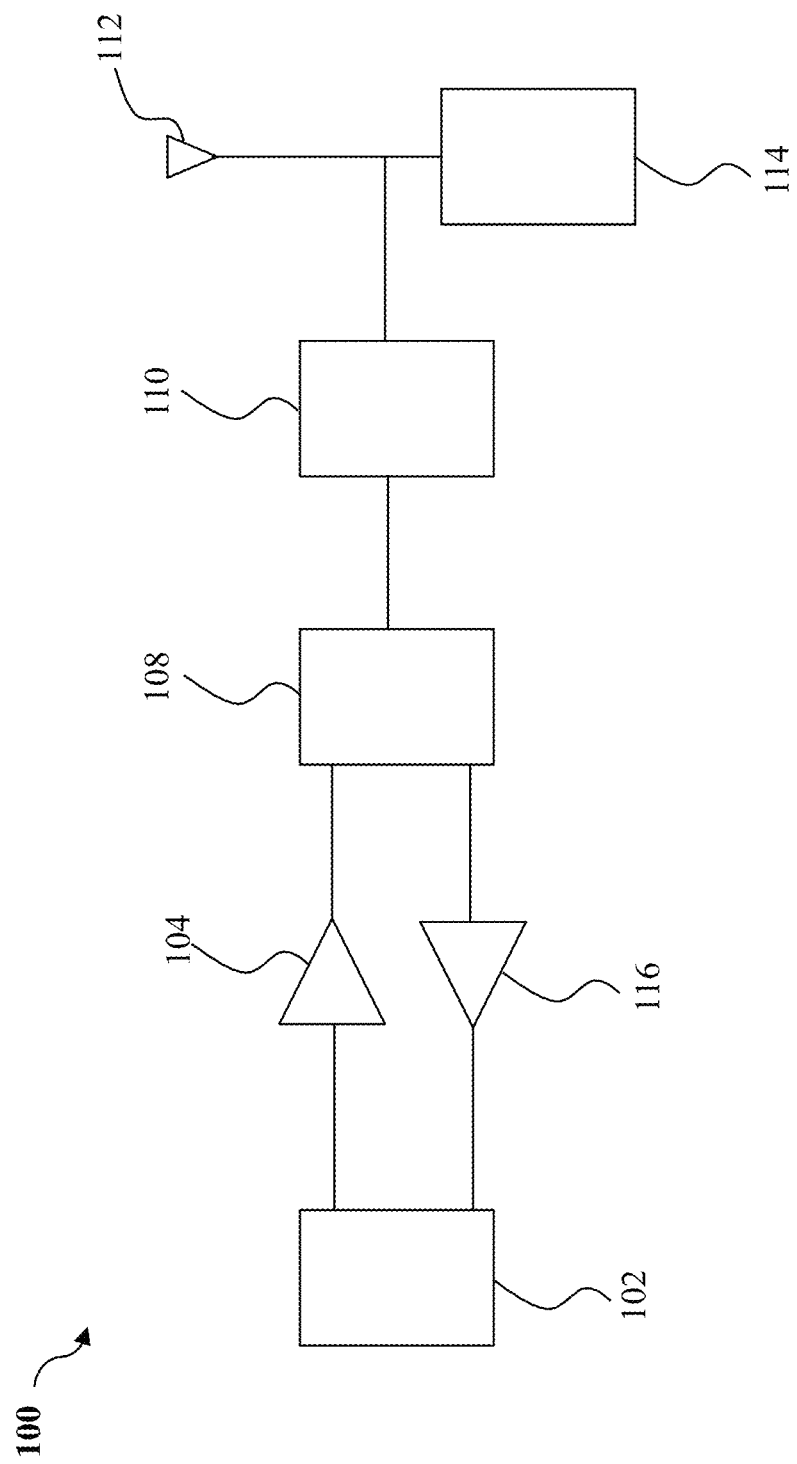
FIG. 1 illustrates an exemplary block diagram of a Radio Frequency (RF) transceiver system, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

In semiconductor technology, III-V semiconductor materials (such as gallium nitride (GaN)) may be used to form various devices. In some examples, one or more GaN-based devices may be used in a Radio Frequency (RF) integrated circuit. The GaN-based devices may be formed in or over a GaN layer. Seal rings may be formed to protect the GaN-based devices from moisture degradation, ionic contamination, and dicing processes. Some existing technologies may include forming both the semiconductor devices and the seal rings directly over the GaN layer. To improve integration density of various electrical components (e.g., transistors, diodes, resistors, capacitors) and/or improve performance of integrated circuit (ICs), 2.5-dimensional (2.5D) integrated circuit (IC) packaging or three-dimensional (3D) IC packaging have begun to be developed. However, stacking or integrating GaN-based devices with other structures to achieve 2.5D IC packaging or 3D IC packaging may cause cracks in portions of the GaN layer that are not protected by the seal rings, and those cracks may propagate into portions of the GaN layer that are parts of the GaN-based devices, leading to problems such as reduced reliability.

The present embodiments are directed to semiconductor structures that include compound semiconductor devices and seal rings, and associated methods. In an exemplary embodiment, a III-V semiconductor layer is formed on a silicon substrate that includes a first region and a second region surrounding the first region. The III-V semiconductor layer is then patterned to cover the first region of the silicon substrate and while the second region of the silicon substrate is not covered by the patterned III-V semiconductor layer. Compound semiconductor devices (such as GaN-based HEMTs) and associated interconnect structure are then formed directly over the first region of the silicon substrate. During the formation of the compound semiconductor devices and associated interconnect structure, a seal ring is formed directly over the second region. That is, the seal ring is formed directly on the silicon substrate and surrounds the III-V semiconductor layer. Therefore, even if cracks may be formed due to, for example, mechanical stress, those cracks may not propagate into the compound semiconductor devices that are protected by the seal rings, thereby improving the reliability of the compound semiconductor devices.

Figure 2:
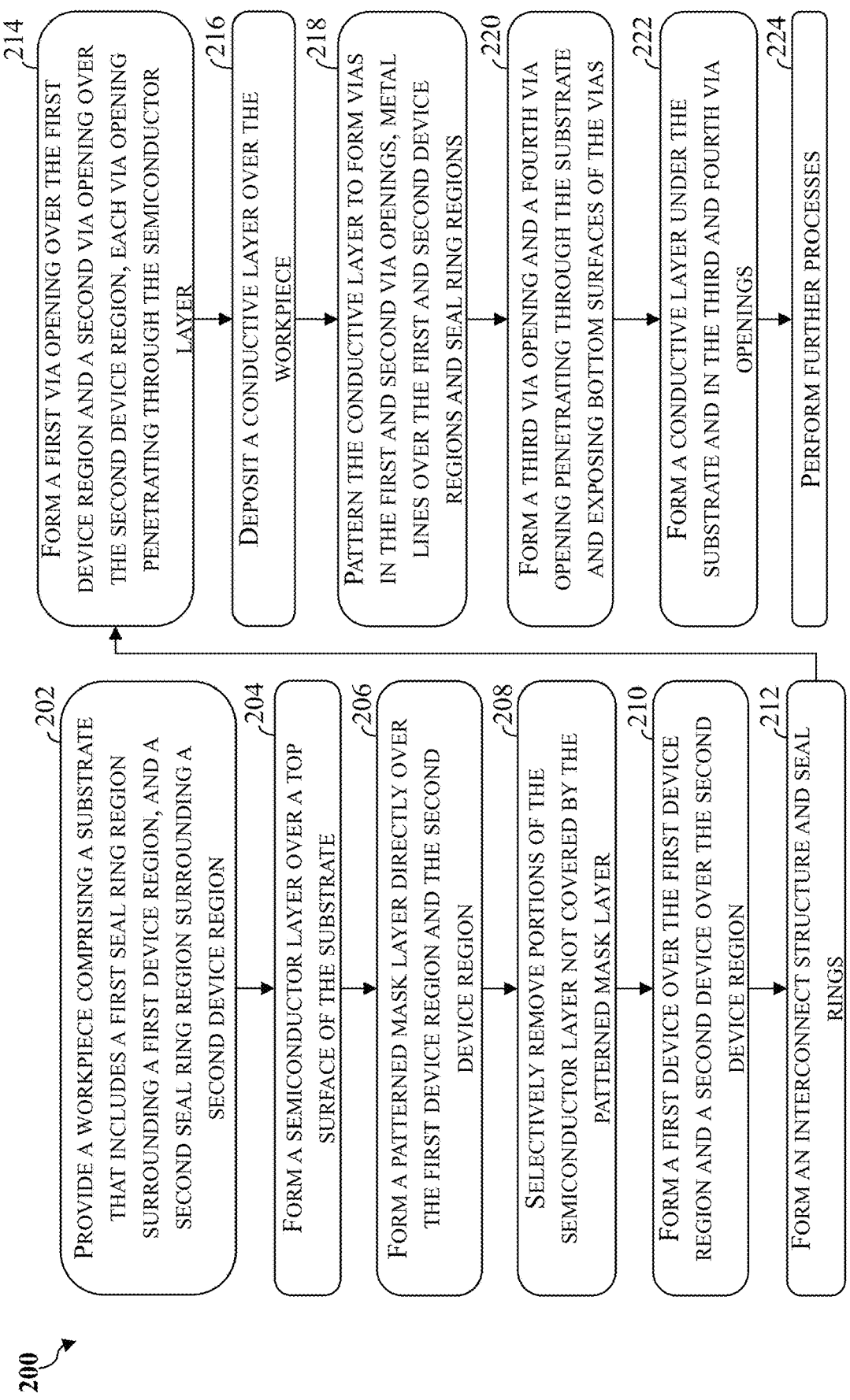
FIG. 2 illustrates a flowchart of an exemplary method for fabricating a semiconductor structure, according to various embodiments of the present disclosure.

The various aspects of the present disclosure will now be described in more detail with reference to the figures. In that regard, FIG. 1 illustrates an exemplary block diagram of a RF transceiver system 100. FIG. 2 is a flowchart illustrating method 200 of forming a semiconductor structure that may be a part of the RF transceiver system 100. Method 200 is described below in conjunction with FIGS. 3-18, which are fragmentary cross-sectional views or top views of a workpiece at different fabrication stages according to embodiments of method 200. FIGS. 19, 20, 21, and 22 are cross-sectional views of packages associated with the RF transceiver system 100. Method 200 is merely an example and is not intended to limit the present disclosure to what is explicitly illustrated therein. Additional steps may be provided before, during and after the method 200, and some steps described can be replaced, eliminated, or moved around for additional embodiments of the method. Not all steps are described herein in detail for reasons of simplicity. Because the workpiece 300 will be fabricated into a semiconductor structure or a die upon conclusion of the fabrication processes, the workpiece 300 may be referred to as the semiconductor structure 300 or the die 300 as the context requires. For avoidance of doubts, the X, Y and Z directions in the figures are perpendicular to one another and are used consistently. Throughout the present disclosure, like reference numerals denote like features unless otherwise excepted.

Referring now to FIG. 1, an exemplary block diagram of a Radio Frequency (RF) transceiver system 100 is illustrated, in accordance with some embodiments of the present disclosure. The RF transceiver system 100 includes a transceiver 102 configured to transmit and/or receive signals, a power amplifier (PA) 104 coupled to an output of the transceiver 102 and configured to amplify an output signal provided by the transceiver 102. The RF transceiver system 100 also includes a filter 108 coupled to the power amplifier 104 and configured to receive the amplified output signal. An antenna switch 110 is coupled to an output of the filter 108. The RF transceiver system 100 also includes at least one antenna 112 coupled to the antenna switch 110 and an antenna tuner 114 coupled to both the at least one antenna 112 and the antenna switch 110. The RF transceiver system 100 also includes a low noise amplifier (LNA) 116 config- ured to amplify a filtered signal received from the filter 108. The transceiver 102 is further configured to receive the amplified filtered signal from the low noise amplifier 116. The operation of the RF transceiver system 100 is omitted for reason of simplicity. It is understood that additional functional blocks may be provided within the RF transceiver system 100 for signal process, and that some functional blocks may be replaced and/or omitted.

In embodiments represented in FIG. 1, the RF transceiver system 100 includes multiple functional blocks. Each functional block may include various electrical components (e.g., transistors, diodes, resistors, capacitors). In some embodiments, the power amplifier 104, the low noise amplifier (LNA) 116, and the antenna switch 110 may include compound semiconductor devices (e.g., GaN-based transistors), the transceiver 102 and the antenna tuner 114 may include silicon-based transistors, and the filter 108 may include a piezoelectric filter. To improve integration density and/or performance of ICs, GaN-based transistors, silicon-based transistors, and the piezoelectric filter may be stacked together to form a 2.5-dimensional (2.5D) integrated circuit (IC) packaging or a three-dimensional (3D) IC packaging. A method of forming a semiconductor structure 300 that includes parts of the power amplifier 104 and the antenna switch 110 will be described with reference to FIGS. 2 and 3-18. Exemplary packages of the RF transceiver system 100 will be described with reference to FIGS. 19-22. By providing the semiconductor structure 300, while integrating the semiconductor structure 300 with other components of the RF transceiver system 100, cracks may be reduced or even eliminated in semiconductor devices in the semiconductor structure 300.

Figure 3:
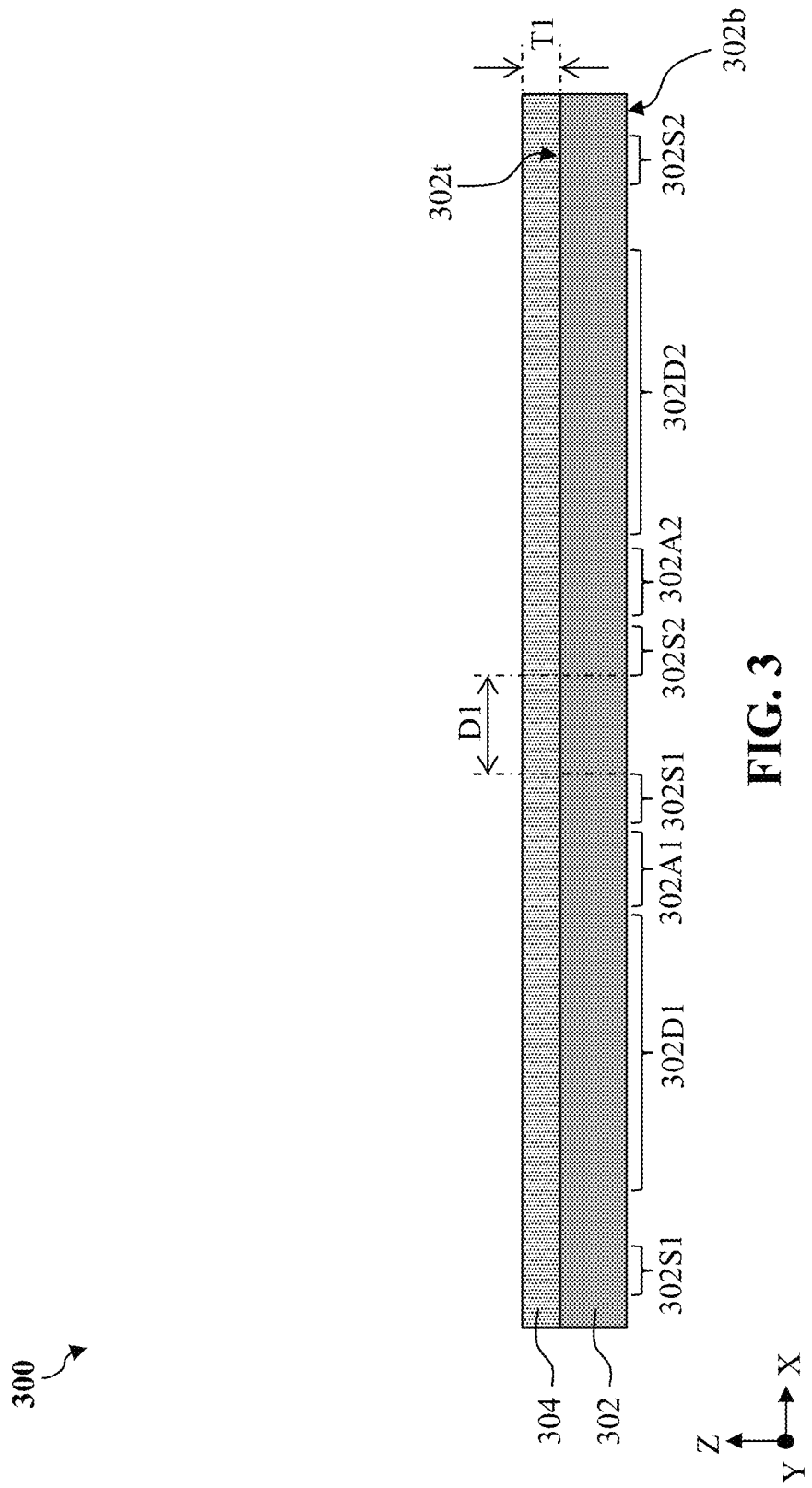

Referring to FIGS. 2 and 3, method 200 includes a block 202 where a workpiece 300 is received. The workpiece 300 includes a substrate 302. The substrate 302 has a top surface 302t and a bottom surface 302b. In an embodiment, the substrate 302 is a bulk silicon substrate (i.e., including bulk single-crystalline silicon). The substrate 302 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 302 may be a semiconductor-on-insulator substrate, such as a silicon-on-insulator (SOI) substrate, a silicon germanium-on-insulator substrate, or a germanium-on-insulator substrate.

In embodiments represented in FIG. 3, the substrate 302 includes a first device region 302D1 for forming a first device (e.g., the first device 308 shown in FIG. 6) thereon, and a second device region 302D2 for forming a second device (e.g., the second device 310 shown in FIG. 6) thereon. The substrate 302 also includes a first seal ring region 302S1 surrounding the first device region 302D1 and a second seal ring region 302S2 surrounding the second device region 302D2. A first seal ring may be formed over the first seal ring region 302S1 to protect the first device from degradation, ionic contamination, and dicing processes, and a second seal ring may be formed over the second seal ring region 302S2 to protect the second device. It is understood that, depending upon specific design requirements, the substrate 302 may include any other suitable number of device regions and any other suitable number of seal ring regions. It is noted that, the first seal ring region 302S1 is spaced apart from the first device region 302D1, and the second seal ring region 302S2 is spaced apart from the second device region 302D2. In some embodiments, the region between the first seal ring region 302S1 and the first device region 302D1 may be referred to as a first assembly isolation region 302A1, and the region between the second seal ring region 302S2 and the second device region 302D2 may be referred to as a second assembly isolation region 302A2. The first seal ring region 302S1 is spaced apart from the second seal ring region 302S2 by a distance D1. In an embodiment, D1 is greater than 0.5 um.

Referring to FIGS. 2 and 3, method 200 includes a block 204 where a semiconductor layer 304 is formed on the top surface 302t of the substrate 302. In an embodiment, the semiconductor layer 304 includes one or more group III-V semiconductor materials such as GaN, AlN, AlGaN, AlInGaN, and/or AlInN, and the semiconductor layer 304 may be referred to a III-V semiconductor layer 304. For example, to form HEMTs in the first device region 302D1 and/or the second device region 302D2, in an embodiment, the semiconductor layer 304 includes a gallium nitride (GaN) layer and an aluminum gallium nitride (AlGaN) layer formed over the GaN layer. In some other embodiments, the semiconductor layer 304 may include one or more group II-VI semiconductor materials, group IV-IV semiconductor materials, or some other suitable semiconductor materials. The semiconductor layer 304 may be epitaxially deposited on the substrate 302 using molecular beam epitaxy (MBE), vapor-phase epitaxy (VPE), ultra-high vacuum CVD (UHV-CVD), and/or other suitable epitaxial growth processes. A thickness T1 of the semiconductor layer 304 may be between about 1 um and about 10 um.

Figure 4:
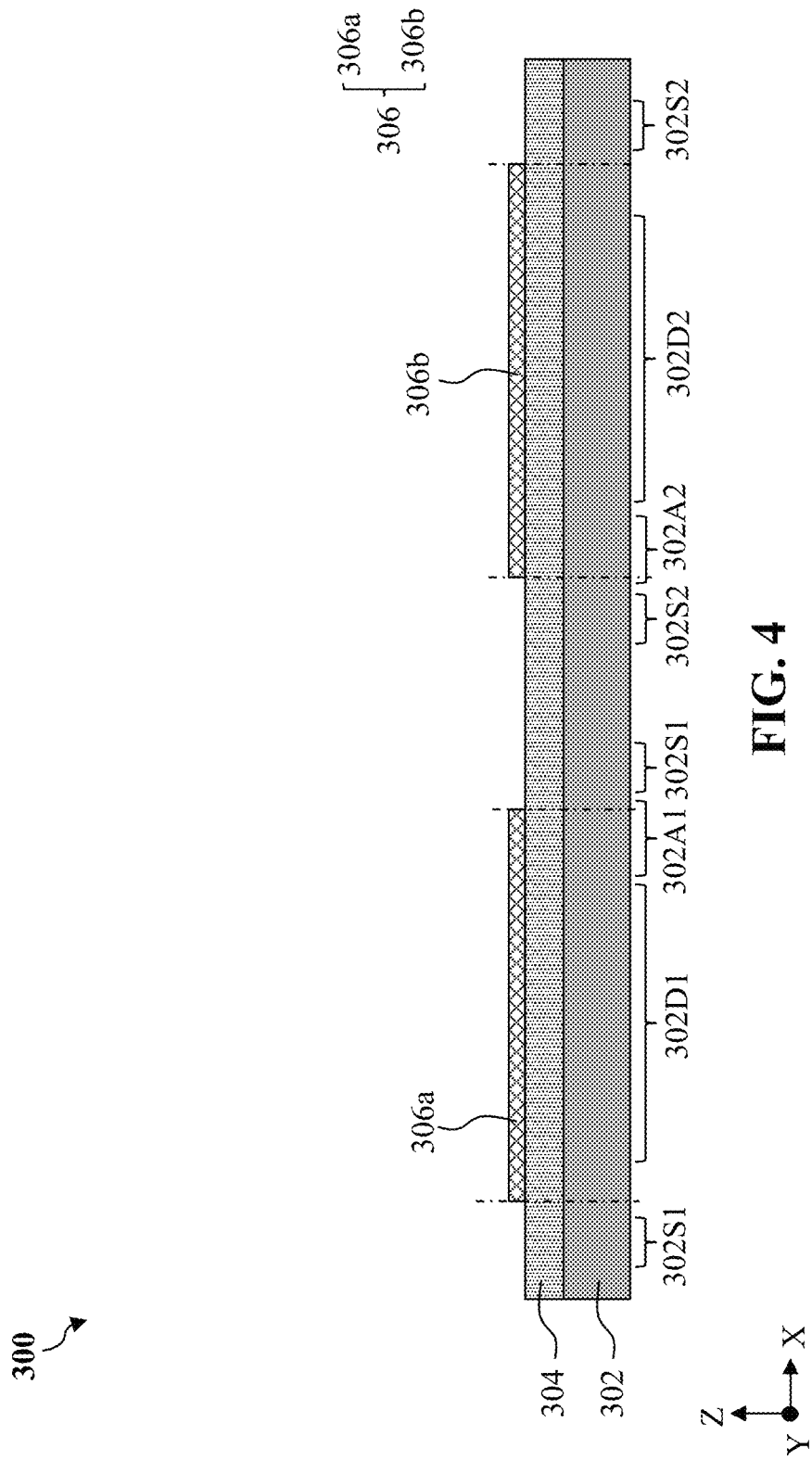

Referring to FIGS. 2 and 4, method 200 includes a block 206 where a patterned mask layer 306 is formed over the III-V semiconductor layer 304. The formation of the patterned mask layer 306 may involve multiple processes. For example, a hard mask layer may be deposited over the III-V semiconductor layer 304. The hard mask layer may include aluminum oxide, silicon oxide, silicon nitride, silicon carbonitride, silicon oxycarbide, silicon oxynitride, silicon oxycarbonitride, other suitable materials, or combinations thereof, and may be formed by chemical vapor deposition (CVD), atomic layer deposition (ALD), physical vapor deposition (PVD), other suitable methods, or combinations thereof. A masking element including a photoresist layer may be then formed over the hard mask layer, exposed to a radiation source through a patterned mask, and subsequently developed to form a patterned masking element. The hard mask layer may then be etched using the patterned masking element as an etch mask to form the patterned mask layer 306. In the present embodiments, the patterned mask layer 306 includes a first portion 306a disposed directly over the first device region 302D1 and a second portion 306b disposed directly over the second device region 302D2. As indicated by the dashed lines shown in FIG. 4, the first portion 306a vertically overlaps with the first assembly isolation region 302A1 without being vertically overlapped with the first seal ring region 302S1, and the second portion 306b vertically overlaps with the second assembly isolation region 302A2 without being vertically overlapped with the second seal ring region 302S2.

Figure 5:
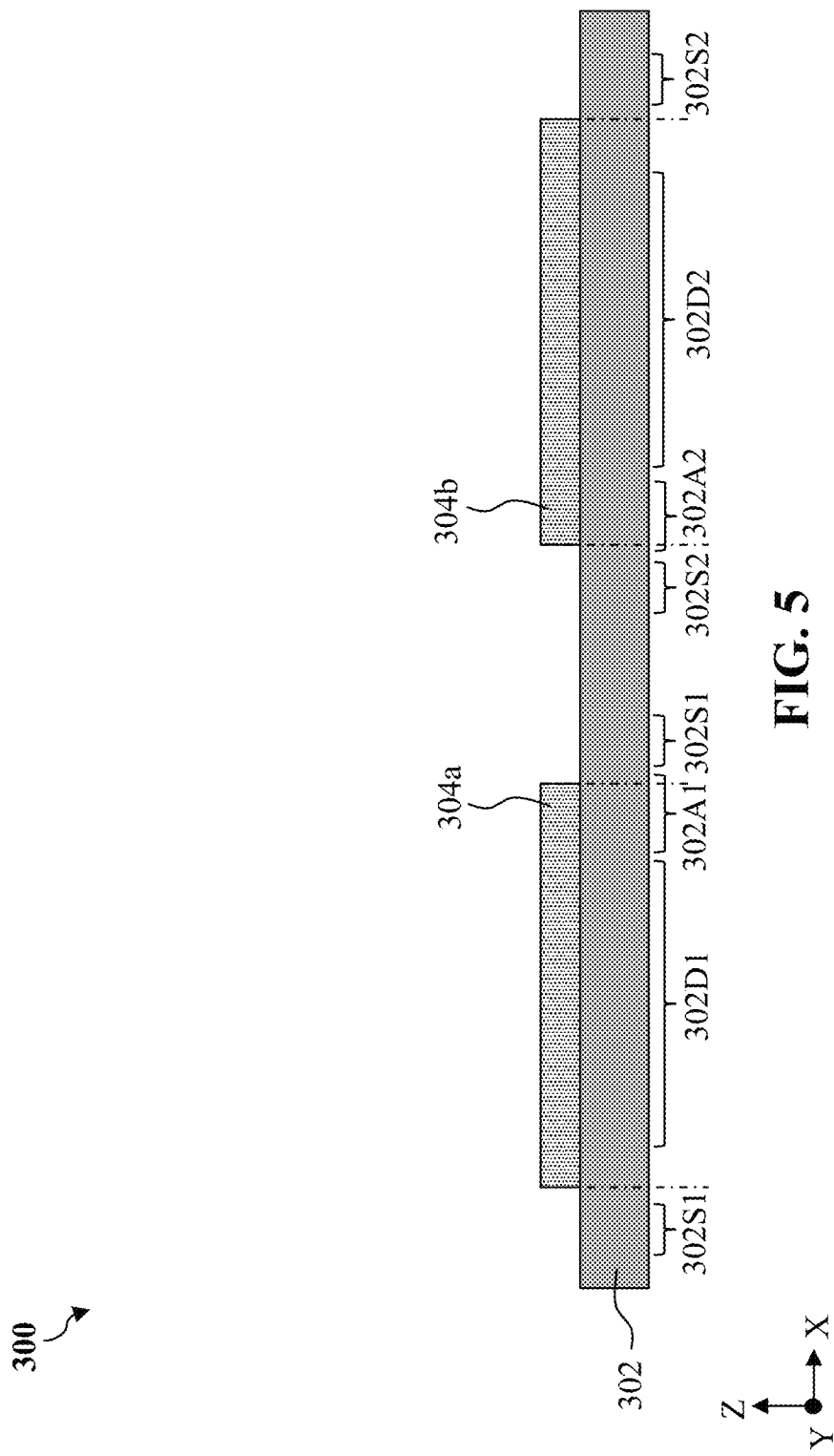

Referring to FIGS. 2 and 5, method 200 includes a block 208 where portions of the semiconductor layer 304 not covered by the patterned mask layer 306 are selectively removed. While using the patterned mask layer 306 as an etch mask, an etching process may be performed to the workpiece 300 to selectively remove portions of the semiconductor layer 304 not covered by the patterned mask layer 306, leaving behind a first portion 304a of the semiconductor layer 304 that is disposed directly under the first portion 306a of the patterned mask layer 306 and a second portion 304b of the semiconductor layer 304 that is disposed directly under the second portion 306b of the patterned mask layer 306 formed over the substrate 302. In embodiments represented in FIG. 5, the first portion 304a of the semiconductor layer 304 is formed directly over an entirety of the first device region 302D1 and a portion of the first assembly isolation region 302A1, and the second portion 304b of the semiconductor layer 304 is formed directly over an entirety of the second device region 302D2 and a portion of the second assembly isolation region 302A2.

Figure 6:
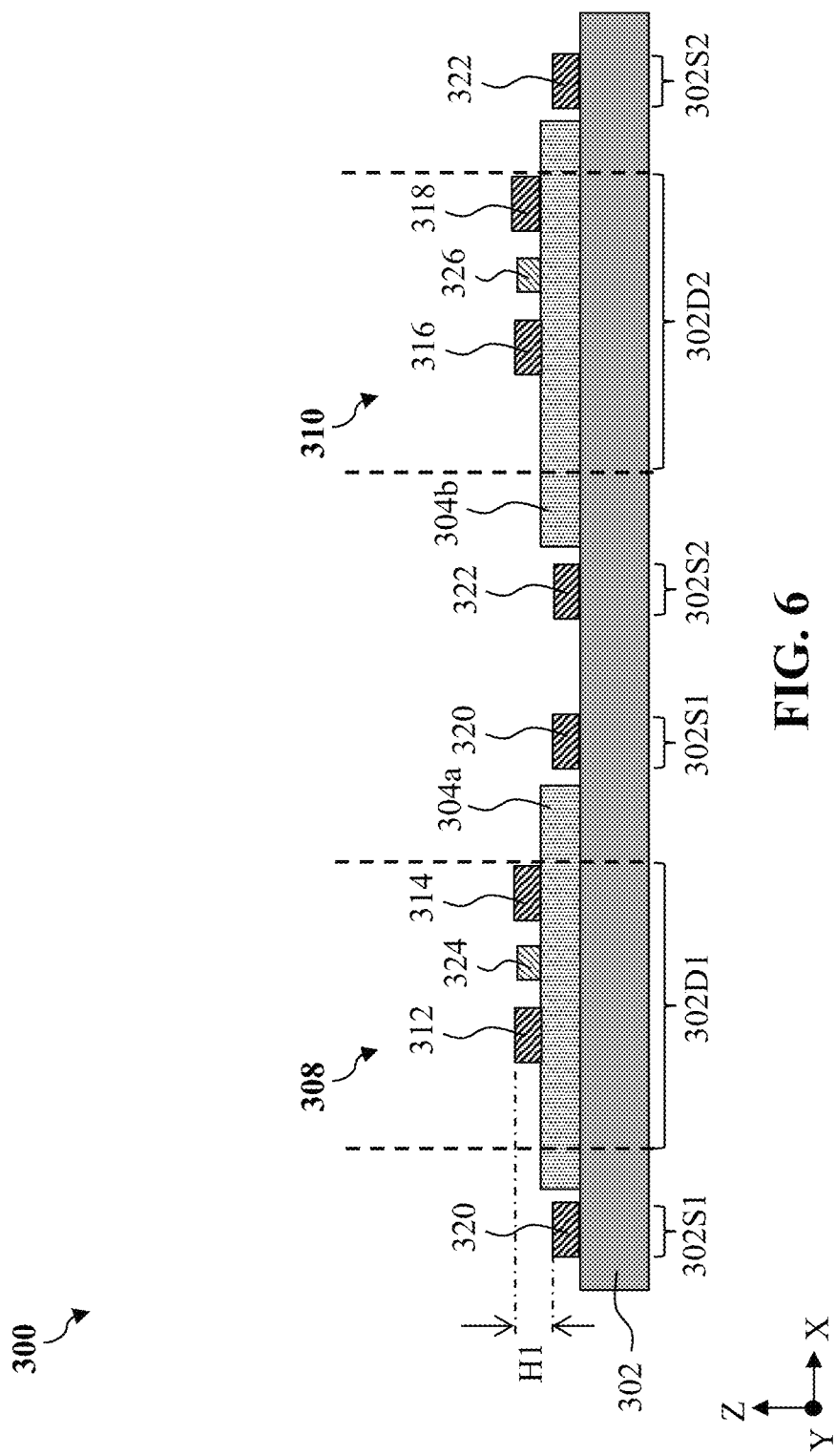

Referring to FIGS. 2 and 6, method 200 includes a block 210 where a first device 308 is formed over the first device region 302D1 and a second device 310 is formed over the second device region 302D2. The first device 308 and the second device 310 may have the same device type or different device types. In the present embodiments, each of the first device 308 and the second device 310 includes a HEMT. The HEMT of the first device 308 is used for forming a power amplifier (e.g., the power amplifier 104 shown in FIG. 1), and the HEMT of the second device 310 is used for forming a switch (e.g., the antenna switch 110 shown in FIG. 1), and these two HEMTs are formed over the same substrate 302. In some embodiments, the formation of the first device 308 and the second device 310 includes depositing a conductive layer over the workpiece 300. A photoresist layer (not shown) may be then formed over the conductive layer and developed to form a patterned photoresist layer. The conductive layer is then patterned using the patterned photoresist layer as an etch mask. For example, portions of the conductive layer not covered by the patterned photoresist layer are removed by, for example, a reactive ion etch (RIE) process to form conductive features 312 and 314 directly over the first device region 302D1 and conductive features 316 and 318 directly over the second device region 302D2. The conductive features 312 and 314 may be configured as the source/drain features for the first device 308, and the conductive features 316 and 318 may be configured as the source/drain features for the second device 310. In the present embodiments, the conductive features 312, 314, 316, and 318 are formed to be in ohmic contact with an upper surface of the first/second portion 304a/304b of the semiconductor layer 304. For ease of description, the conductive feature 312 may be referred to as a first source feature 312 or a first source contact 312, the conductive feature 314 may be referred to as a first drain feature 314 or a first drain contact 314, the conductive feature 316 may be referred to as a second source feature 316 or a second source contact 316, and the conductive feature 318 may be referred to as a second drain feature 318 or a second drain contact 318.

In the present embodiments, the patterning of the conductive layer further forms a conductive feature 320 directly over the first seal ring region 302S1 and a conducive feature 322 directly over the second seal ring region 302S2. That is, the thickness and composition of the conducive features 320 and 322 formed directly over the first and second seal ring regions 302S1 and 302S2 are the same as those of the contacts 312, 314, 316, and 318 formed directly over the first and second device regions 302D1 and 302D2. Although the conducive features 320 and 322 are formed simultaneously with the contacts 312, 314, 316, and/or 318, due to the formation of the first portion 304a and the second portion 304b of the semiconductor layer 304, a top surface of the first source contact 312 is higher than a top surface of the conducive feature 320, and a height difference H1 between those top surfaces is equal to the thickness T1 of the semiconductor layer 304 and thus between about 1 um and 10 um. For ease of description, the conductive feature 320 may be referred to as a bottommost conductive feature 320 of a first seal ring 350 (shown in FIG. 9), and the conductive feature 322 may be referred to as a bottommost conductive feature 322 of a second seal ring 352 (shown in FIG. 9). It is understood that the patterning of the conductive layer may form more bottommost conductive features over the first seal ring region 302S1 and/or the second seal ring region 302S2. The patterned photoresist layer may be removed after the formation of those conductive features 312, 314, 316, 318, 320, 322. It is understood that, before forming the conductive features 312, 314, 316, 318, 320, 322, additional processes may be performed to facilitate the formation of the desired first device 308 and second device 310. After forming those conductive features 312, 314, 316, 318, 320, 322, additional steps may be performed to form a first gate structure 324 over the first device region 302D1 and a second gate structure 326 over the second device region 302D2. Detailed description of the formation of the first gate structure 324 and the second gate structure 326 is omitted for reason of simplicity. In some embodiments, the first device 308 and/or the second device 310 may include one or more field plates. It is understood that the configuration of the first and second source contacts 312, 316, the first and second drain contacts 314, 318, and the first and second gate structures 324, 326 shown in FIG. 6 are just an example. Other configurations are also possible.

Figure 7:
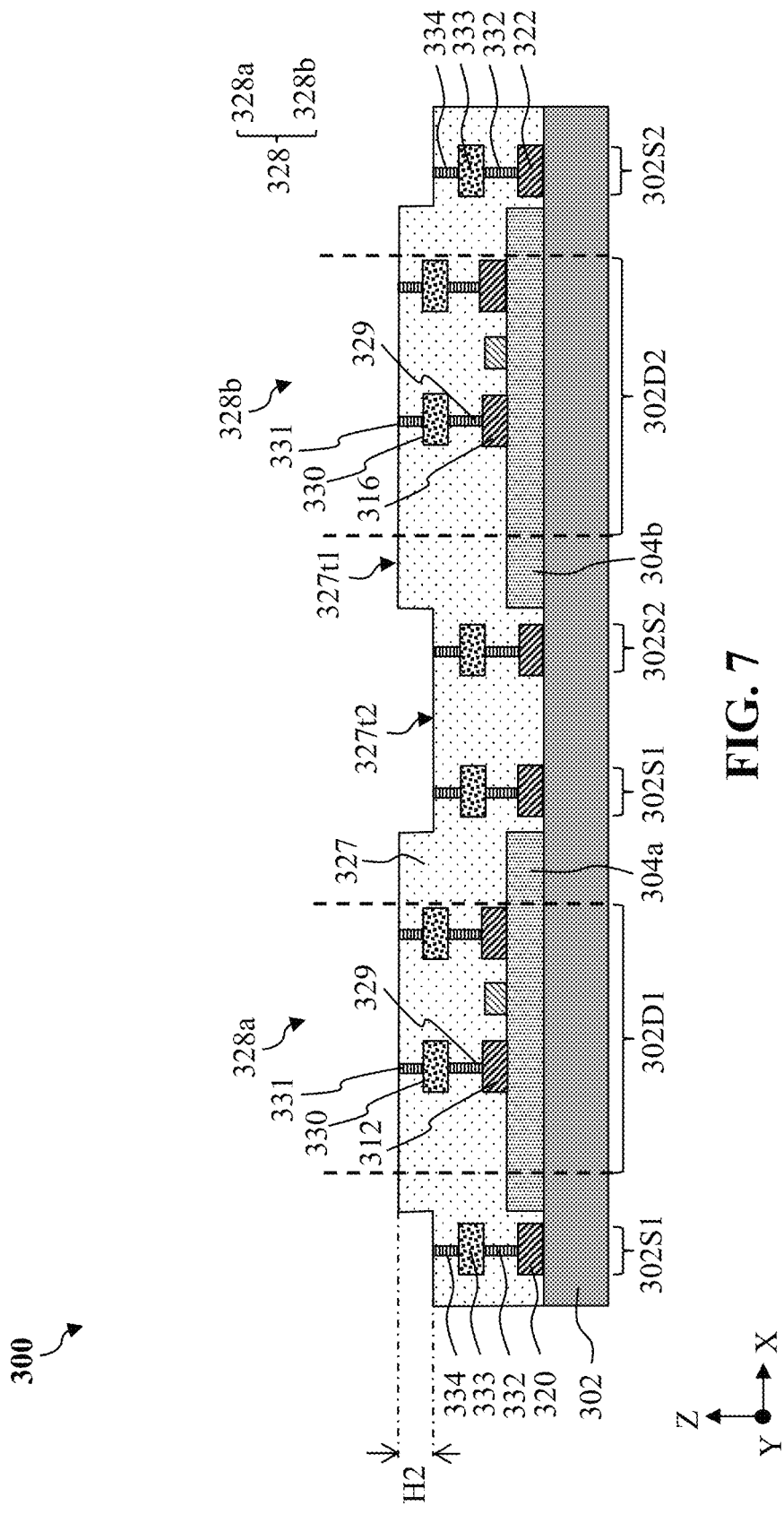

Referring to FIGS. 2 and 7, method 200 includes a block 212 where an intermediate structure of an interconnect structure 328 is formed over the first device region 302D1 and the second device region 302D2, a number of conductive features are formed over the first seal ring region 302S1, and a number of conductive features are formed over the second seal ring region 302S2. The interconnect structure 328 is formed to facilitate the operation of the first device 308 and the second device 310 and/or may provide interconnections (e.g., wiring) between components (e.g., gate structures and/or source/drain features) of the workpiece 300. In embodiments represented in FIG. 7, the interconnect structure 328 includes a first portion 328a formed directly over the first device region 302D1 and a second portion 328b formed directly over the second device region 302D2. The first portion 328a of the interconnect structure 328 may be referred to as a first interconnect structure 328a, and the second portion 328b of the interconnect structure 328 may be referred to as a second interconnect structure 328b.

The intermediate structure of the first interconnect structure 328a includes multiple metal layers or metallization layers. Each of the metal layers includes multiple conductive components embedded in an intermetal dielectric (IMD) layer. For example, the first interconnect structure 328a includes a first via 329 formed directly on the first source contact 312, a first metal line 330 formed directly on the first via 329, and a second via 331 formed directly on the first metal line 330. The first interconnect structure 328a also includes a number of conductive components (not separately labeled) electrically coupled to the first drain contact 314 and a number of conductive components (not shown) electrically coupled to the first gate structure 324. Those conductive components may be in a way similar to those electrically coupled to the first source contact 312. In the present embodiments, the second interconnect structure 328b is in a way similar to the first interconnect structure 328a and repeated description is also omitted for reason of simplicity. The first source contact 312, the first via 329, the first metal line 330, and the second via 331 are embedded in a dielectric structure 327. The dielectric structure 327 may include multiple IMD layers, and each IMD layer may include silicon oxide ($SiO_2$), silicon nitride (SiN), combinations thereof, or other suitable materials. Each IMD layer may be conformally deposited over the workpiece 300 to have a generally uniform thickness over the top surface of the workpiece 300.

During the formation of the intermediate structure of the interconnect structure 328, a number of conductive features are formed over the first seal ring region 302S1 and a number of conductive features are formed over the second seal ring region 302S2. For example, a via 332 is formed directly on the bottommost conductive feature 320, a metal line 333 formed on the via 332, and a via 334 formed on the metal line 333. In some embodiments, the via 332 and the first via 329 may be formed by a common deposition process and thus have the same composition and thickness. The metal line 333 and the first metal line 330 may be formed by a common deposition process, and the via 334 and the second via 331 may be formed by a common deposition process. Due to the height relationship between the first source contact 312 and the bottommost conductive feature 320, a top surface 327t1 of a portion of the dielectric structure 327 disposed directly over the first portion 304a and the second portion 304b of the semiconductor layer 304 is higher than a top surface 327t2 of a portion of the dielectric structure 327 disposed directly over the first and second seal ring regions 302S1 and 302S2, and a height difference H2 may be substantially equal to the thickness T1 of the semiconductor layer 304.

Figure 8:
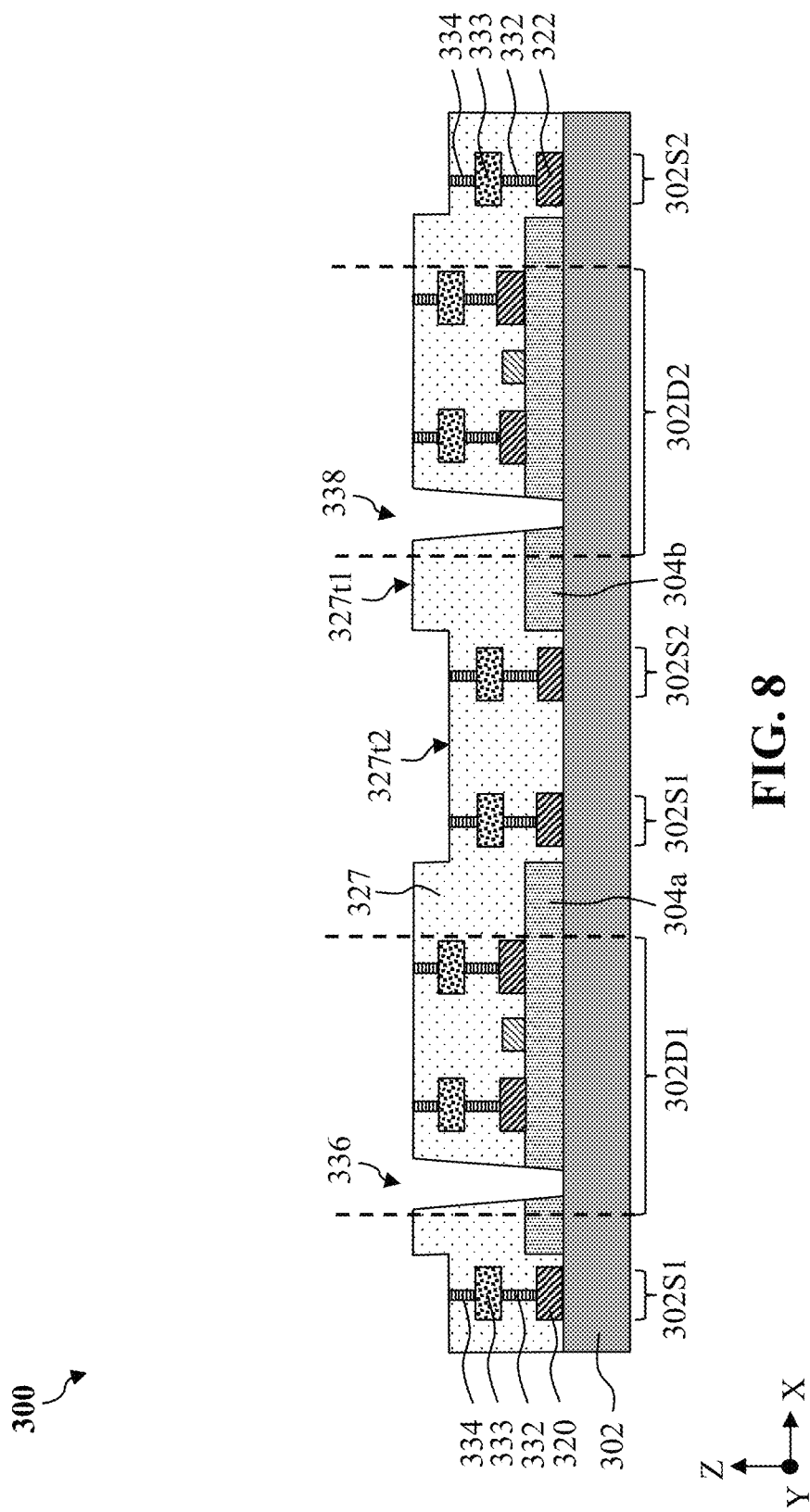

Referring to FIGS. 2 and 8, method 200 includes a block 214 where a first via opening 336 is formed directly over the first device region 302D1 and a second via opening 338 is formed directly over the second device region 302D2. In the present embodiments, after forming the intermediate structure of the interconnect structure 328, the first via opening 336 and the second via opening 338 are formed directly over the first device region 302D1 and the second device region 302D2, respectively. The formation of the first via opening 336 and the second via opening 338 may include forming a patterned mask film over the workpiece 300 and performing one or more etching processes to selectively remove portions of the dielectric structure 327 not covered by the patterned mask film and portions of the semiconductor layer 304 thereunder, thereby exposing portions of the top surface 302t of the substrate 302. The etching process may be stopped after portions of the top surface 302t of the substrate 302 being exposed. That is, each of the first and second via openings 336 and 338 penetrates through the first portion 304a and the second portion 304b of the semiconductor layer 304, respectively.

Figure 9:
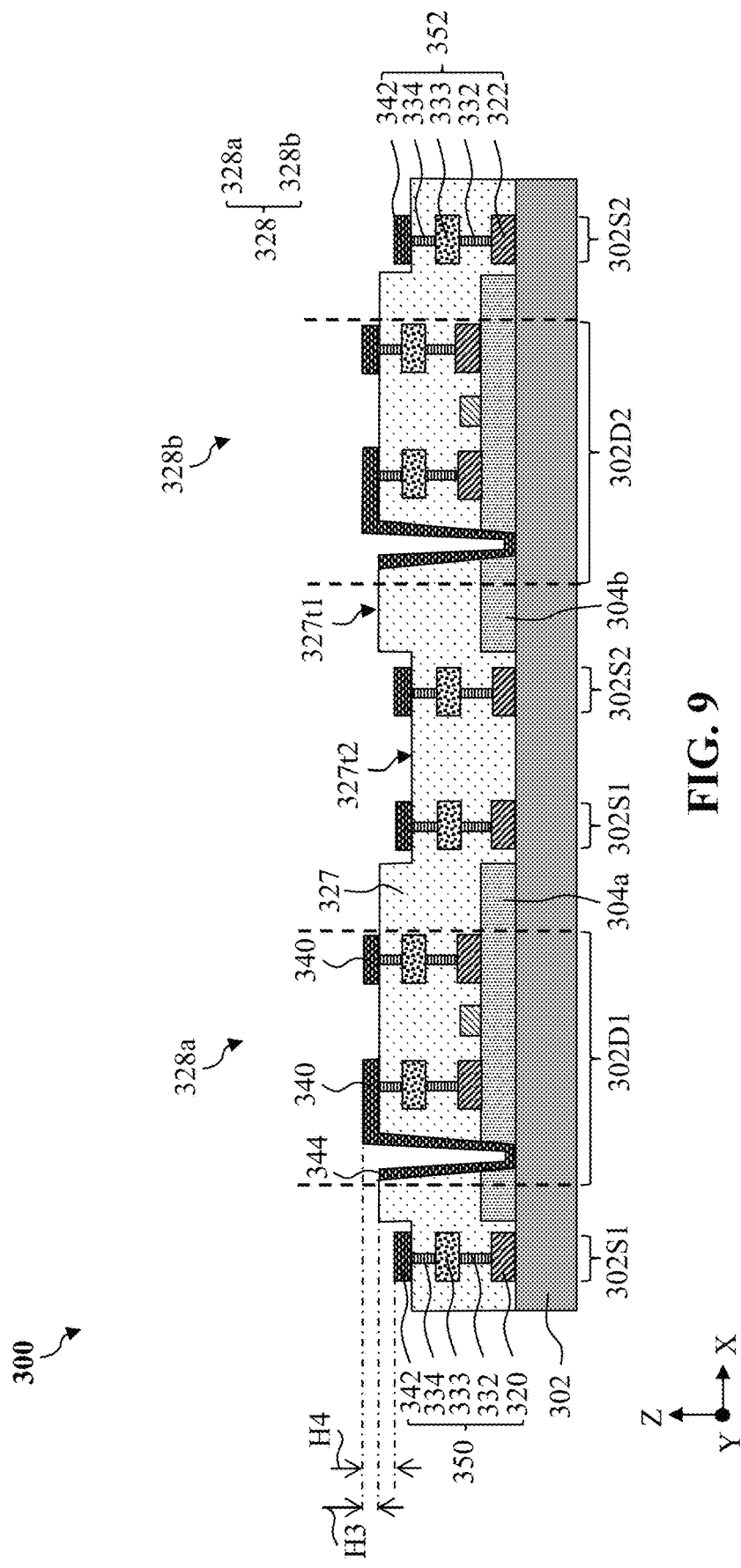

Referring to FIGS. 2 and 9, method 200 includes a block 216 where a conductive layer is deposited over the workpiece 300. The conductive layer (not shown) may be deposited over the workpiece 300 to have a generally uniform thickness over the top surface of the workpiece 300, including in the first and second via openings 336 and 338. In an embodiment, the conductive layer may include titanium nitride (TiN), aluminum, copper, combinations thereof, or other suitable materials. A thickness of the conductive layer may be between about 2 um and about 10 um.

Still referring to FIGS. 2 and 9, method 200 includes a block 218 where the conductive layer is patterned to form various segments in the first and second device regions 302D1 and 302D2, including the first and second via openings 336 and 338, and in the first and second seal ring regions 302S1 and 302S2. For ease of description, segments formed on the top surface 327t1 (and thus over the first and second device regions 302D1 and 302D2) may be referred to as metal lines 340, segments formed on the top surface 327t2 (and thus over the first and second seal ring regions 302S1 and 302S2) may be referred to as metal lines 342. Since each of the segments formed in the first and second via openings 336 and 338 extends through the semiconductor layer 304, each of those segments may be referred to as a through semiconductor via 344. A top surface of the through semiconductor via 344 is coplanar with the top surface 327t1. Since those segments are formed by patterning a common conductive layer that has a uniform thickness, a top surface of the metal line 340 is higher than a top surface of the through semiconductor via 344, and a height difference H3 is substantially equal to the thickness of the metal line 340; a top surface of the metal line 340 is higher than a top surface of the metal line 342, and a height difference H4 is substantially equal to the thickness T1 of the semiconductor layer 304. In the present embodiments, the through semiconductor via 344 formed over the first device region 302D1 is electrically coupled to the first source contact 312. More specifically, an integral conductive feature is formed by patterning the conductive layer, and the integral conductive feature includes the through semiconductor via 344 formed in the first via opening 336 and the metal line 340 that is electrically couple to the first source contact 312. The through semiconductor via and metal lines formed over the second device region 302D2 are in a way similar to those formed over the first device region 302D1 and repeated description is omitted for reason of simplicity.

In the present embodiments, upon conclusion of the forming of the metal lines 340, the fabrication of the interconnect structure 328 is finished. More specifically, a final structure of the first interconnect structure 328a includes the first via 329 formed on the first source contact 312, the first metal line 330 formed on the first via 329, the second via 331 formed on the first metal line 330, and the metal line 340 formed on the second via 331, and the conductive components formed over and electrically coupled to the first drain contact 314. A final structure of the second interconnect structure 328b is in a way similar to the first interconnect structure 328a and related description is omitted for reason of simplicity. The bottommost conductive feature 320, the via 332, the metal line 333, the via 334, and the metal line 342 may be collectively referred to as a first seal ring 350. The bottommost conductive feature 322, the via 332, the metal line 333, the via 334, and the metal line 342 may be collectively referred to as a second seal ring 352. In embodiments represented in FIG. 9, a top surface of a topmost conductive feature (e.g., the metal line 340) of the interconnect structure 328 is higher than a top surface of a topmost conductive feature (i.e., the metal line 342) of the first seal ring 350. It is understood that the interconnect structure 328 may include less or more metal layers, and accordingly, the first and second seal rings 350 and 352 may include corresponding numbers of conductive features.

Figure 10:
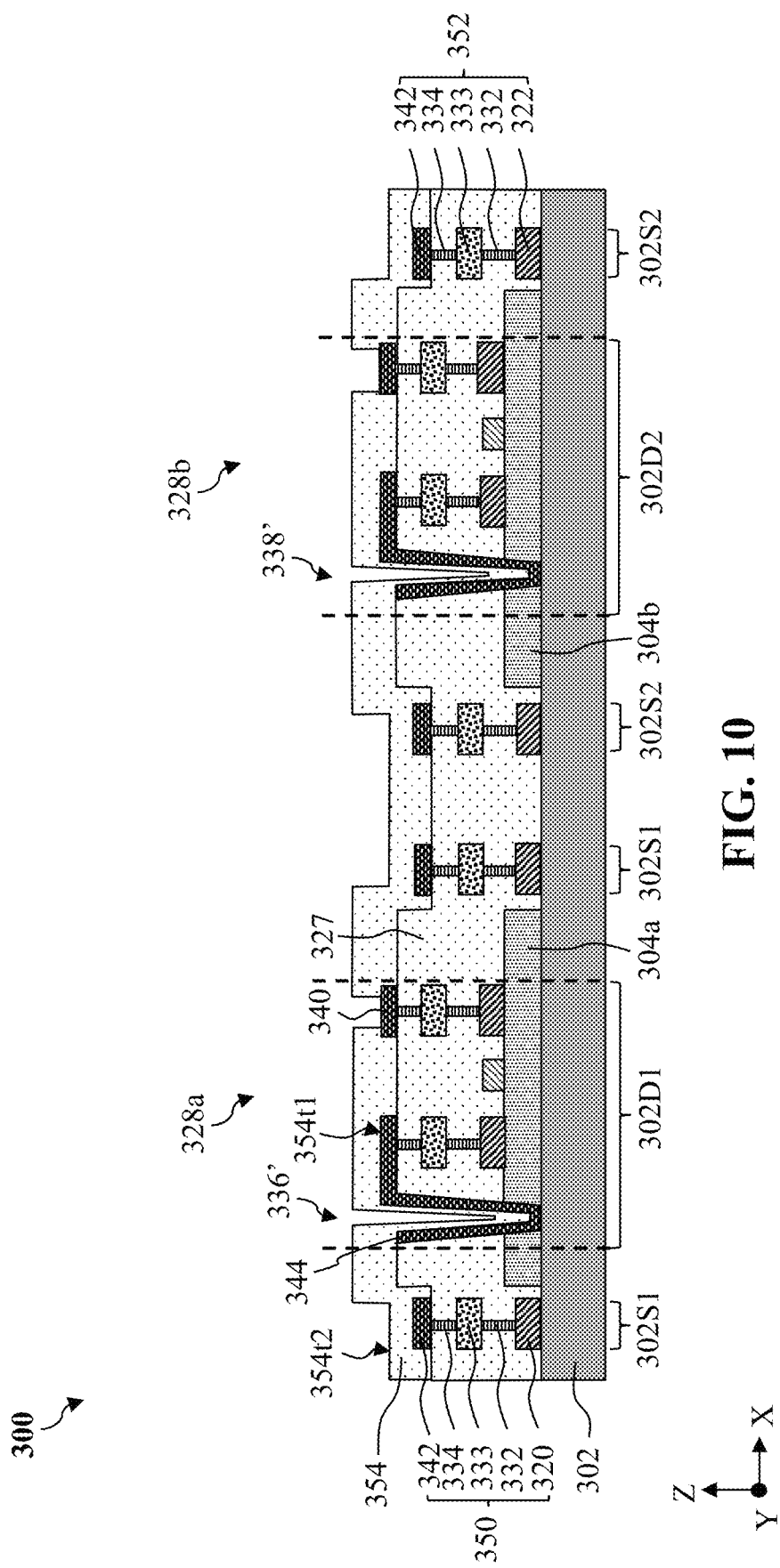

After forming the interconnect structure 328, the first seal ring 350, and the second seal ring 352, as shown in FIG. 10, a passivation structure 354 is conformally formed over the workpiece 300. A top surface 354t1 of a portion of the passivation structure 354 that is formed directly over the metal line 340 is higher than a top surface 354t2 of a portion of the passivation structure 354 that is formed directly over the metal line 342. In some embodiments, the passivation structure 354 may include silicon oxide, silicon nitride, other suitable materials, or combinations thereof. A total thickness of the dielectric structure 327 and the passivation structure 354 may be between about 3 um and about 10 um. A number of openings may be formed to expose the metal lines 340 that are electrically coupled to the drain contacts (e.g., the first drain contact 314, the second drain contact 318) to facilitate the operation of the first device 308 and the second device 310. After forming the passivation structure 354, the first via opening 336 and the second via opening 338 may still be partially filled. The unfilled portion of the first via opening 336 may be referred to as an opening 336', and the unfilled portion of the second via opening 338 may be referred to as an opening 338'.

Figure 11:
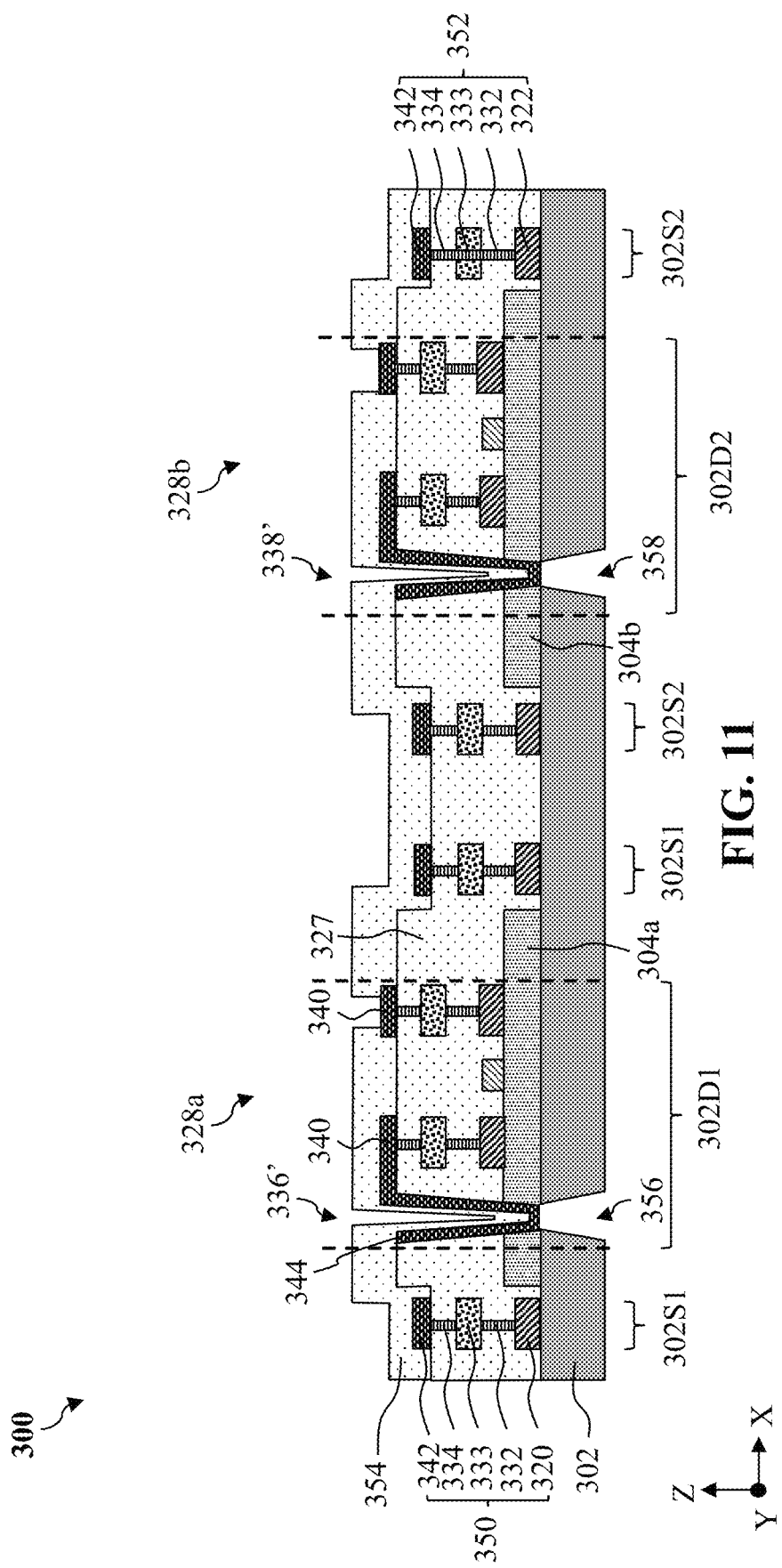

Referring to FIGS. 2 and 11, method 200 includes a block 220 where a third via opening 356 is formed over the first device region 302D1 and a fourth via opening 358 is formed over the second device region 302D2. Each of the third via opening 356 and the fourth via opening 358 penetrates from the bottom surface 302b of the substrate 302. A patterned mask layer may be formed under the bottom surface 302b of the substrate 302 and cover portions of the substrate 302. An etching process may be then conducted to selectively remove portions of the substrate 302 not covered by the patterned mask layer to form the third via opening 356 over the first device region 302D1 and the fourth via opening 358 over the second device region 302D2. The third via opening 356 exposes a bottom surface of the through semiconductor via 344 formed in the first via opening 336, and the fourth via opening 358 exposes a bottom surface of the through semiconductor via 344 formed in the second via opening 338.

Referring to FIGS. 2 and 12, method 200 includes a block 222 where a conductive layer 360 is formed under the bottom surface 302b of the substrate 302 and in the third and fourth via openings 356 and 358. The conductive layer 360 may be deposited to have a uniform thickness and tracks the surface of the back side of the substrate 302. A portion of the conductive layer 360 formed in the third via opening 356 may be referred to as a through substrate via 360a, and a portion of the conductive layer 360 formed in the fourth via opening 358 may be referred to as a through substrate via 360b. The through substrate via 360a is in direct contact with the through semiconductor via 344 formed directly over the first device region 302D1, and the through substrate via 360b is in direct contact with the through semiconductor via 344 formed directly over the second device region 302D2. The conductive layer 360 may include copper (Cu) or other suitable material and may have a thickness ranged between about 1 um and about 20 um. In some embodiments, the conductive layer 360 may be a part of a redistribution structure.

Figure 14:
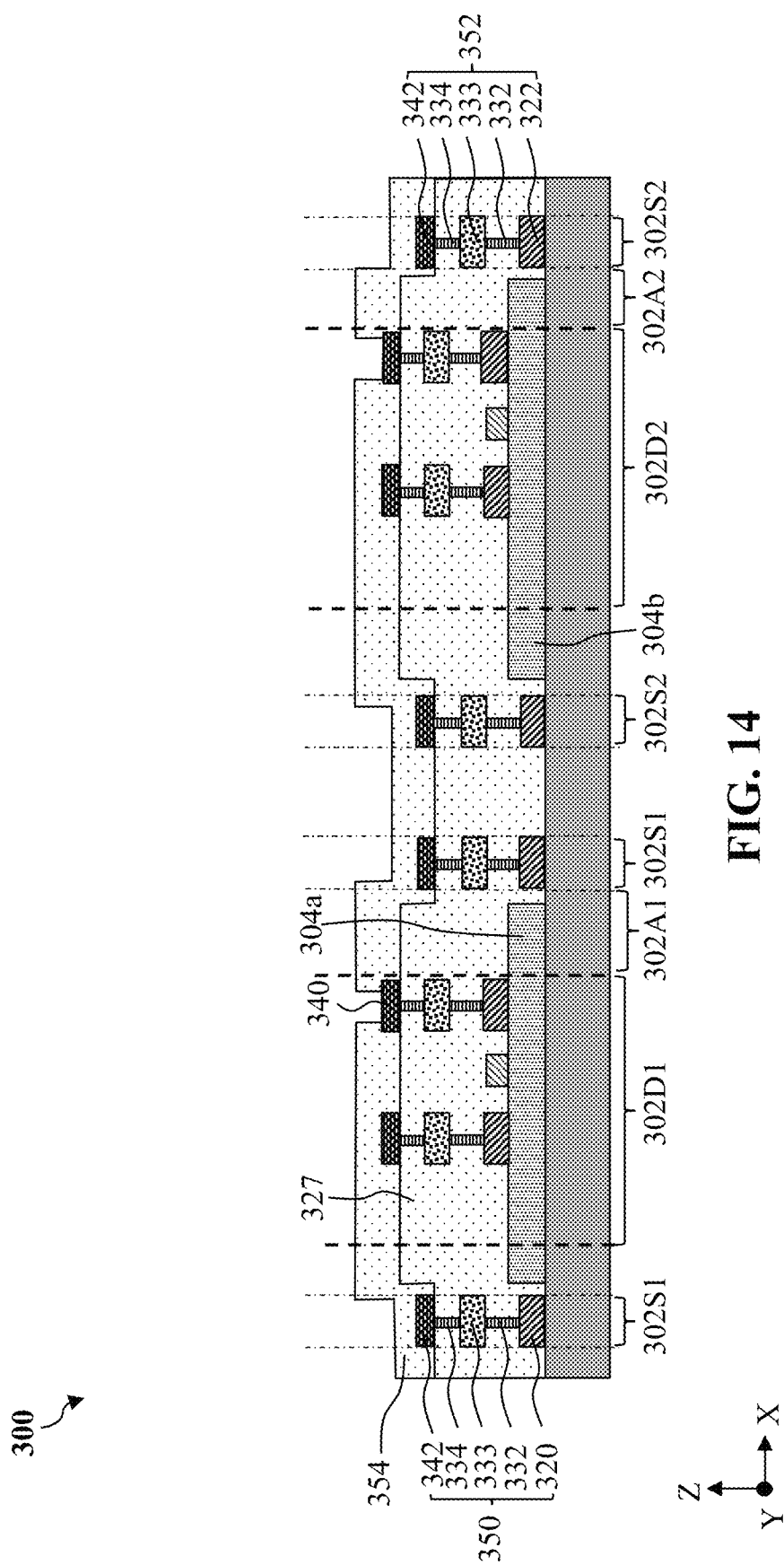
FIG. 14 illustrates a fragmentary cross-sectional view of the workpiece taken along line C-C' shown in FIG. 13, according to various embodiments of the present disclosure.
Figure 15:
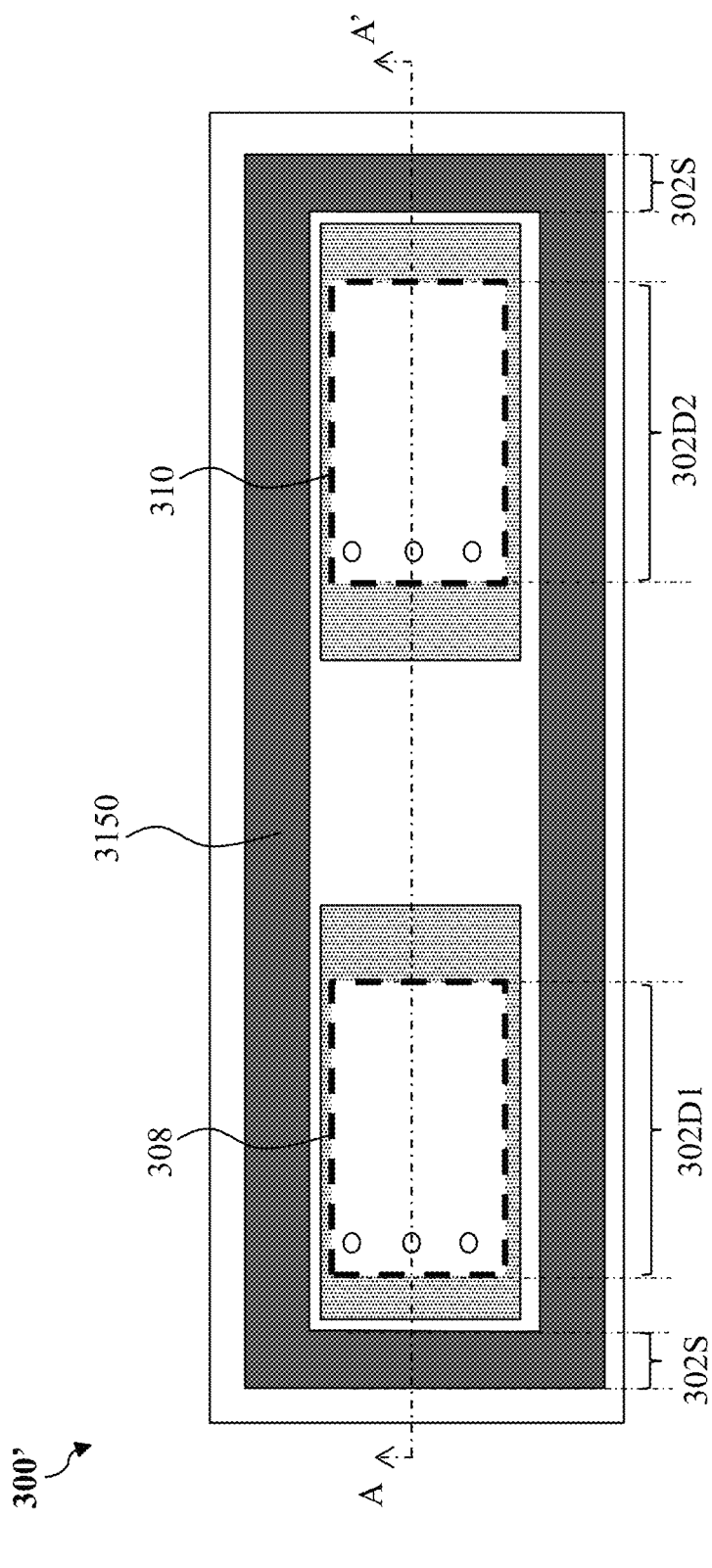
FIG. 15 illustrates a fragmentary top view of an alternative workpiece, according to various embodiments of the present disclosure.
Figure 16:
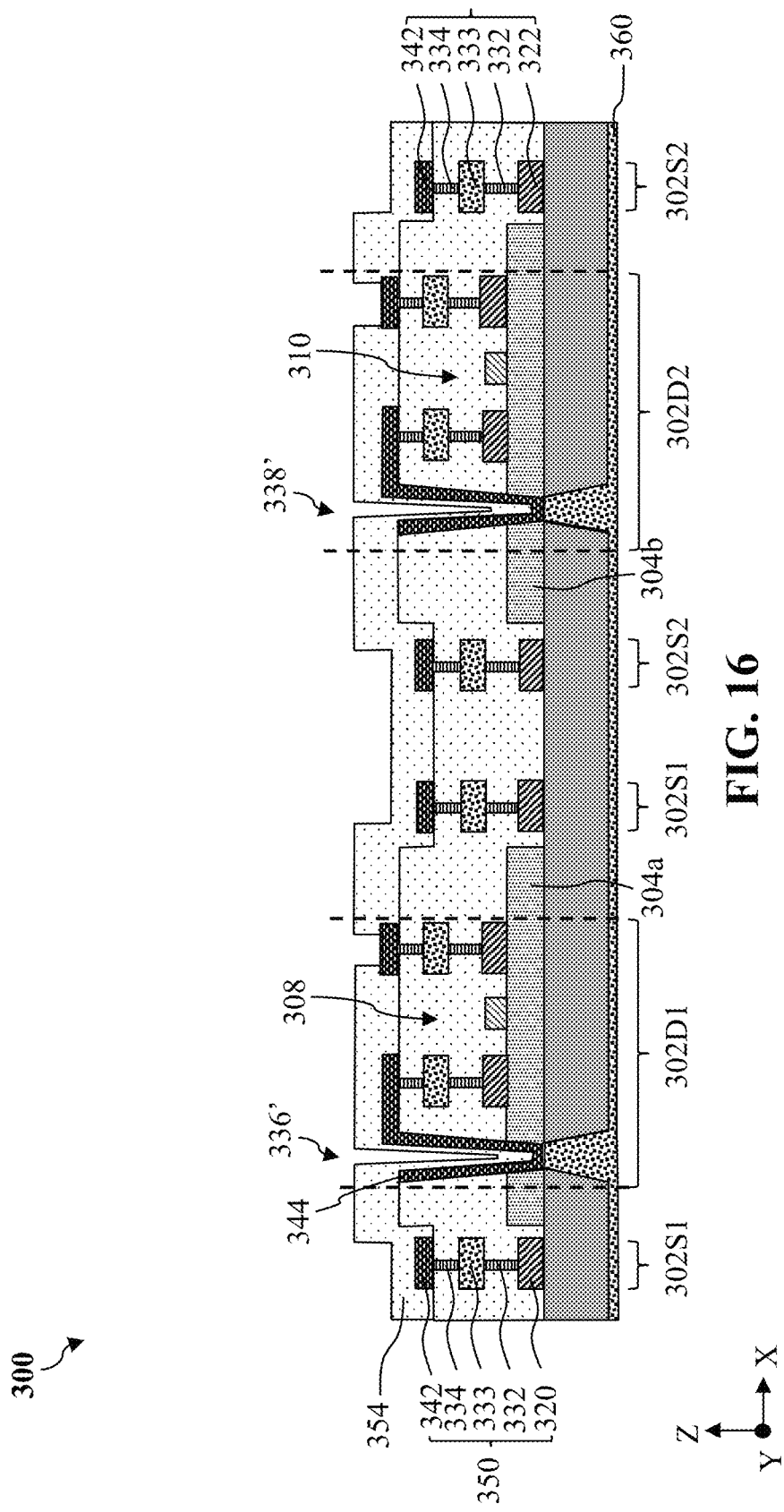
FIG. 16 illustrates a fragmentary cross-sectional view of a first alternative workpiece, according to various embodiments of the present disclosure.
Figure 17:
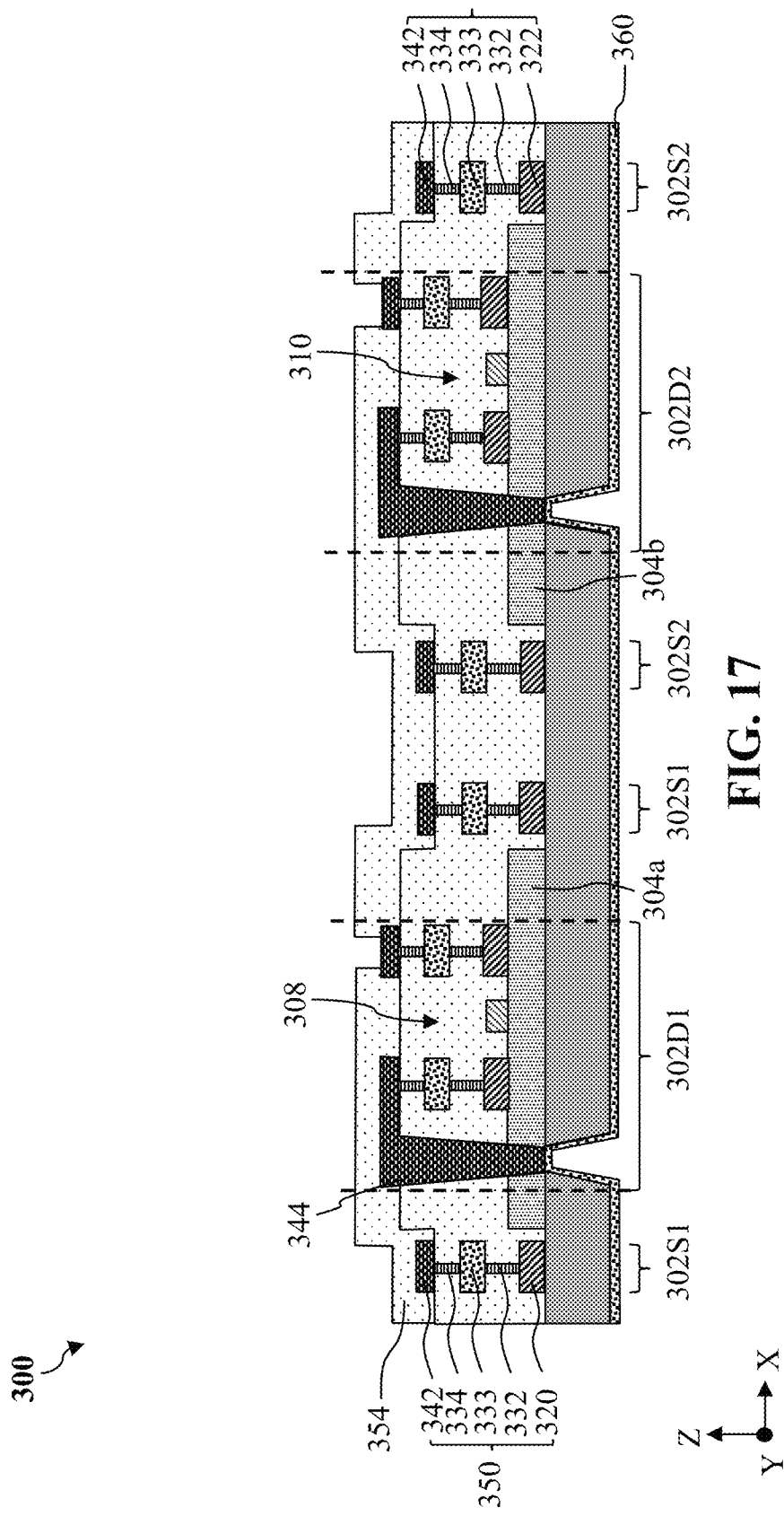
FIG. 17 illustrates a fragmentary cross-sectional view of a second alternative workpiece, according to various embodiments of the present disclosure.
Figure 18:
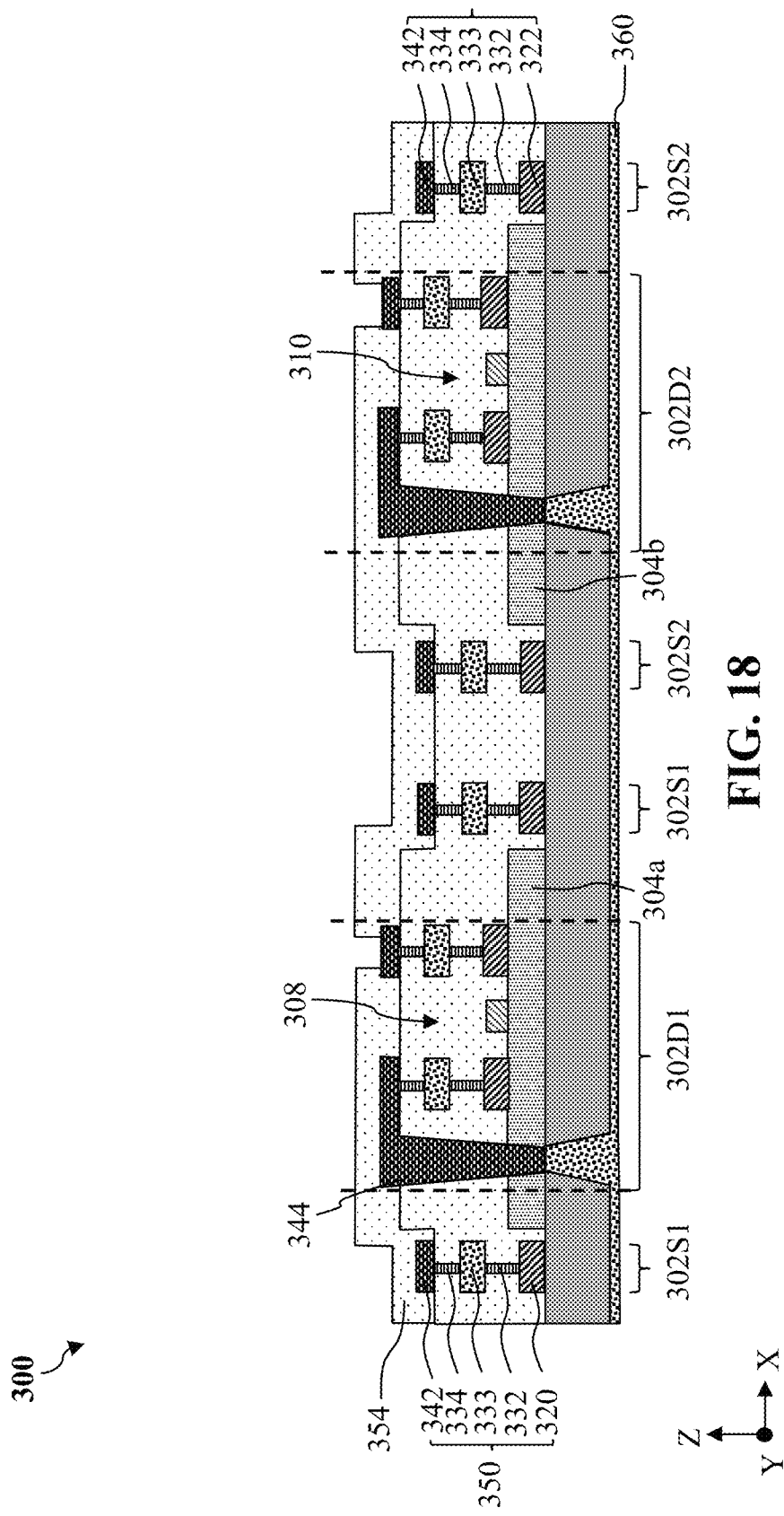
FIG. 18 illustrates a fragmentary cross-sectional view of a third alternative workpiece, according to various embodiments of the present disclosure.

FIG. 13 depicts a fragmentary top view of the workpiece 300 shown in FIG. 12. More specifically, FIG. 12 is a fragmentary cross-sectional view of the workpiece 300 taken along line A-A' shown in FIG. 13. FIG. 14 further depicts a fragmentary cross-sectional view of the workpiece 300 taken along line C-C' shown in FIG. 13. In embodiments represented in FIGS. 12, 13, and 14, the workpiece 300 includes the first portion 304a of the semiconductor layer 304, the first device 308 formed in and over the first portion 304a, and the first seal ring 350 surrounding the first device 308. The first seal ring 350 is formed directly over the substrate 302 and is spaced apart from the first portion 304a of the semiconductor layer 304 by the dielectric structure 327 and the passivation structure 354. A bottom surface of the bottommost conductive feature 320 of the first seal ring 350 is in direct contact with the top surface 302t of the substrate 302. The workpiece 300 also includes the second portion 304b of the semiconductor layer 304, the second device 310 formed on and over the second portion 304b, and the second seal ring 352 surrounding the second device 310. The second seal ring 352 is formed directly over the substrate 302 and is spaced apart from the second portion 304b of the semiconductor layer 304 by the dielectric structure 327 and the passivation structure 354. In an embodiment, a bottom surface of the bottommost conductive feature 322 of the second seal ring 352 is in direct contact with the top surface 302t of the substrate 302. In an embodiment, a fragmentary cross-sectional view of the workpiece 300 taken along line C-C' is in a way similar to the fragmentary cross-sectional view of the workpiece 300 taken along line A-A', except that the cross-sectional view of the workpiece 300 represented in FIG. 14 doesn't include the openings 336' and 338'.

Referring to FIG. 2, method 200 includes a block 224 where further processes are performed. Such further processes may include forming a front-side redistribution structure over the top surface of the workpiece 300. The front-side redistribution structure may include one or more redistribution layers (RDLs) that may be utilized to provide an external electrical connection to the first device 308, the second device 310, and/or to the through semiconductor vias 344. The front-side redistribution structure may include any suitable number of dielectric layers, metallization patterns, and vias. Such further processes may include forming connectors over the passivation structure 354. The connectors may include solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors may include a conductive material such as solder, copper, aluminum, gold, nickel, silver, palladium, tin, the like, or combinations thereof. The connectors may form a grid, such as a ball grid array (BGA). Such further processes may include attaching the workpiece 300 to one or more structures. The one or more structures may include, for example, an integrated circuit die, a package, a printed circuit board (PCB), or an interposer.

In the above embodiments described with reference to FIGS. 12 and 13, the first device 308 is surrounded by the first seal ring 350, the second device 310 is surrounded by the second seal ring 352, and the first seal ring 350 is spaced apart from the second seal ring 352 by the distance D1. In some other implementations, the first device 308 and the second device 310 may be surrounded by a common seal ring. For example, in embodiments represented in FIG. 15, the workpiece 300' includes the first device 308 formed over the first device region 302D1 and the second device 310 formed over the second device region 302D2, and a seal ring 3150 formed over a seal ring region 302S that surrounds the first device region 302D1 and the second device region 302D2. A cross-sectional view of the workpiece 300' taken along line A-A' shown in FIG. 15 may be in a way similar to the workpiece 300 shown in FIG. 12, expect that the workpiece 300' doesn't include the number of conductive features formed over a portion of the substrate that is disposed laterally between first device region 302D1 and the second device region 302D2.

In the above embodiments described with reference to FIG. 12, the first via opening 336 and the second via opening 338 (shown in FIG. 8), and the third via opening 356 and the fourth via opening 358 (shown in FIG. 11) each are partially filled by a respective conducive layer. Other configurations are possible. For example, in embodiments represented in FIG. 16, while the first via opening 336 and the second via opening 338 are partially filled, the third via opening 356 and the fourth via opening 358 are substantially filled by the conductive layer 360. In embodiments represented in FIG. 17, while the third via opening 356 and the fourth via opening 358 are partially filled by the conductive layer 360, the first via opening 336 and the second via opening 338 are substantially filled by a conductive layer. In embodiments represented in FIG. 18, the first via opening 336 and the second via opening 338, and the third via opening 356 and the fourth via opening 358 are all substantially filled by a respective conductive layer.

Figure 19:
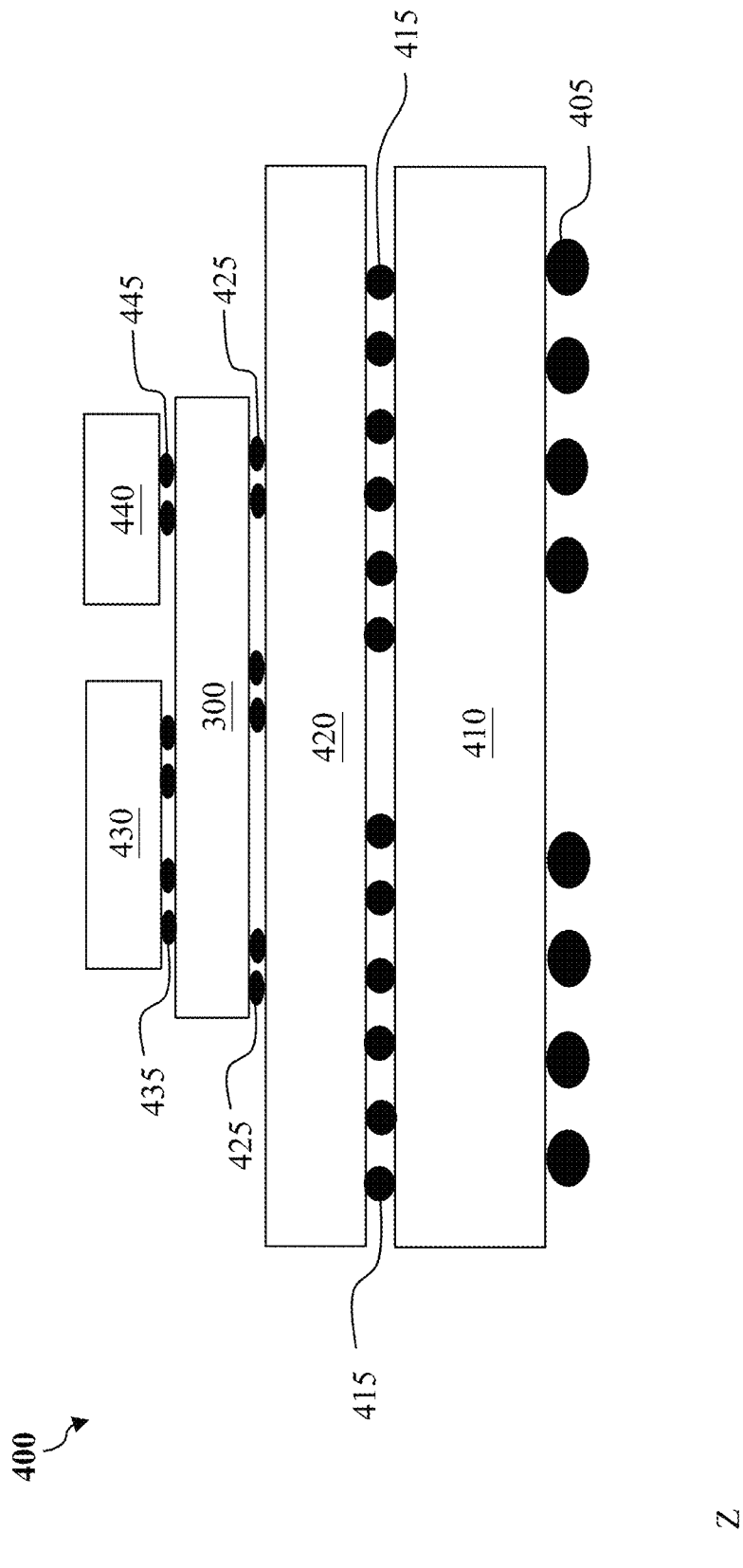
FIGS. 19, 20, 21, 22 are cross-sectional views of packages associated with the RF transceiver system, according to various embodiments of the present disclosure.

In some embodiments, after forming the semiconductor structure 300 shown in FIGS. 12-13, the semiconductor structure 300 and other structures may be integrated to form the RF transceiver system 100. FIG. 19 is a cross-sectional view of a package 400 of the RF transceiver system 100, according to various embodiments of the present disclosure. The package 400 of the RF transceiver system 100 in the present embodiments is a three-dimensional integrated circuit (3DIC). The package 400 includes a package substrate 410 that includes a top surface and a bottom surface. A number of connectors 405, such as Ball Grid Array ("BGA") balls, may be formed under the bottom surface of the package substrate 410. The package 400 also includes an interposer 420 electrically and mechanically coupled to the top surface of the package substrate 410 via a number of connectors 415. In some embodiments, the connectors 415 may include Controlled Collapse Chip Connection ("C4") bumps. The package 400 also includes the die 300 electrically and mechanically coupled to the top surface of the interposer 420 via a number of connectors 425. In the present embodiments, the die 300 includes at least parts of the power amplifier 104 and the antenna switch 110. In some embodiments, the die 300 may also include the low noise amplifier 116. The package 400 also includes a first die 430 stacked on and electrically coupled to the die 300 via a number of connectors 435 and a second die 440 stacked on and electrically coupled to the die 300 via a number of connectors 445. The first die 430 may include the transceiver 102 and the antenna tuner 114, and the second die 440 may include the filter 108.

By forming the die 300 that includes one or more semiconductor devices (e.g., the first device 308 and/or the second device 310) formed in and over the semiconductor layer 304 while not forming the corresponding seal ring (e.g., the first seal ring 350 and/or the second seal ring 352) directly over the semiconductor layer 304, when integrating the die 300 with the other structures to form the package 400, cracks that may be formed outside the seal ring will not propagate into the semiconductor devices protected by the seal ring, thereby improving the package's reliability.

Figure 20:
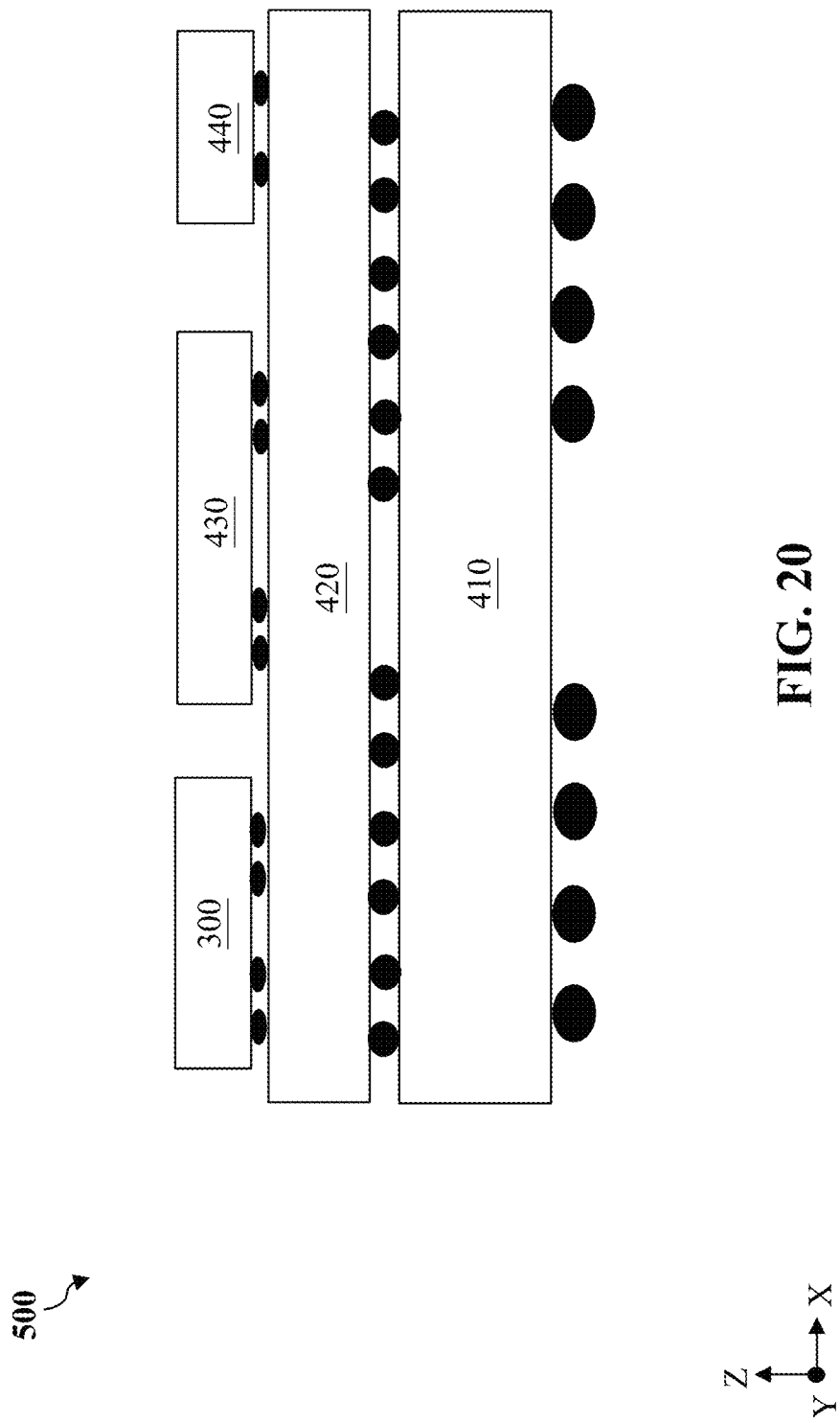
Figure 21:
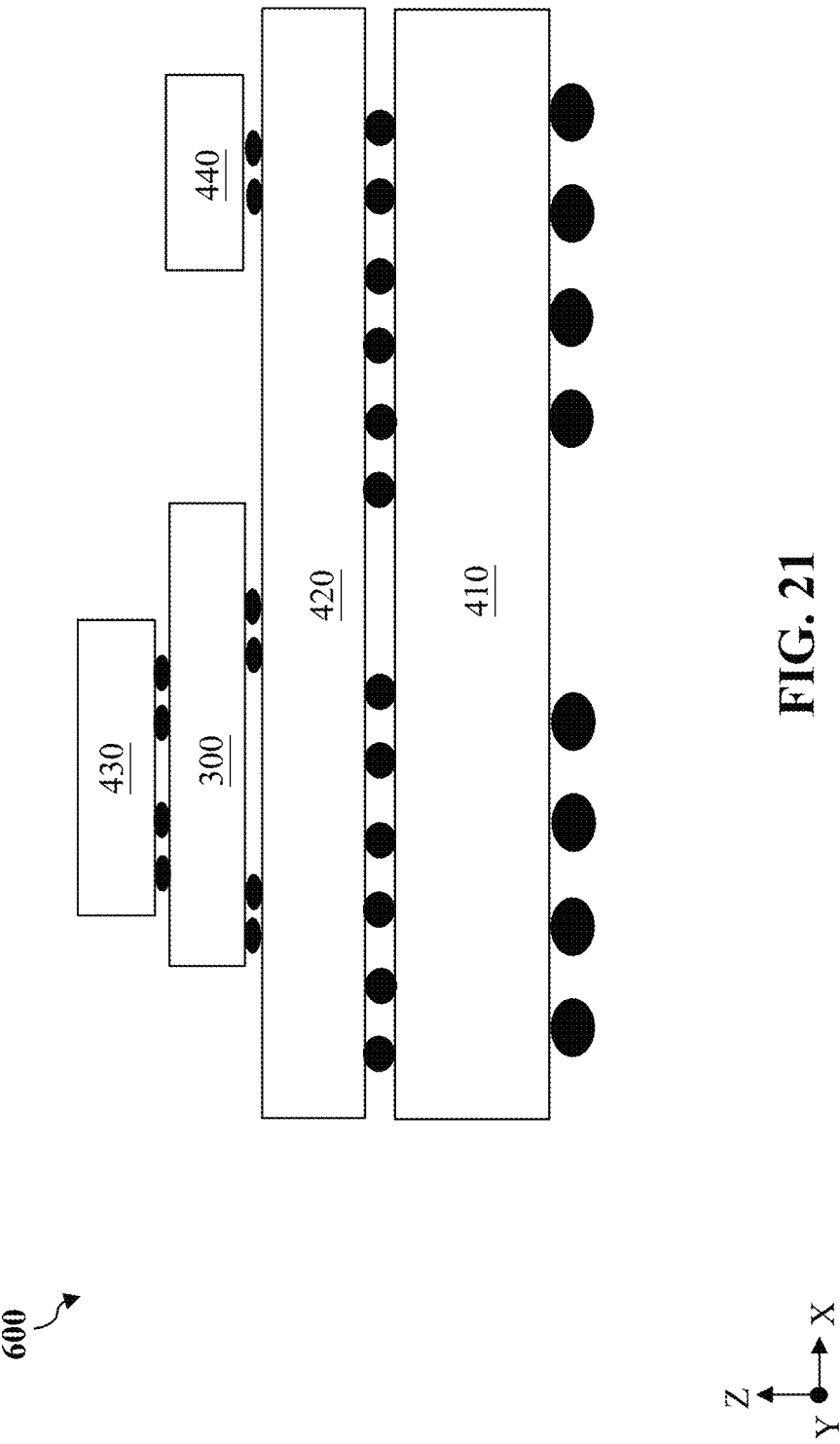
Figure 22:
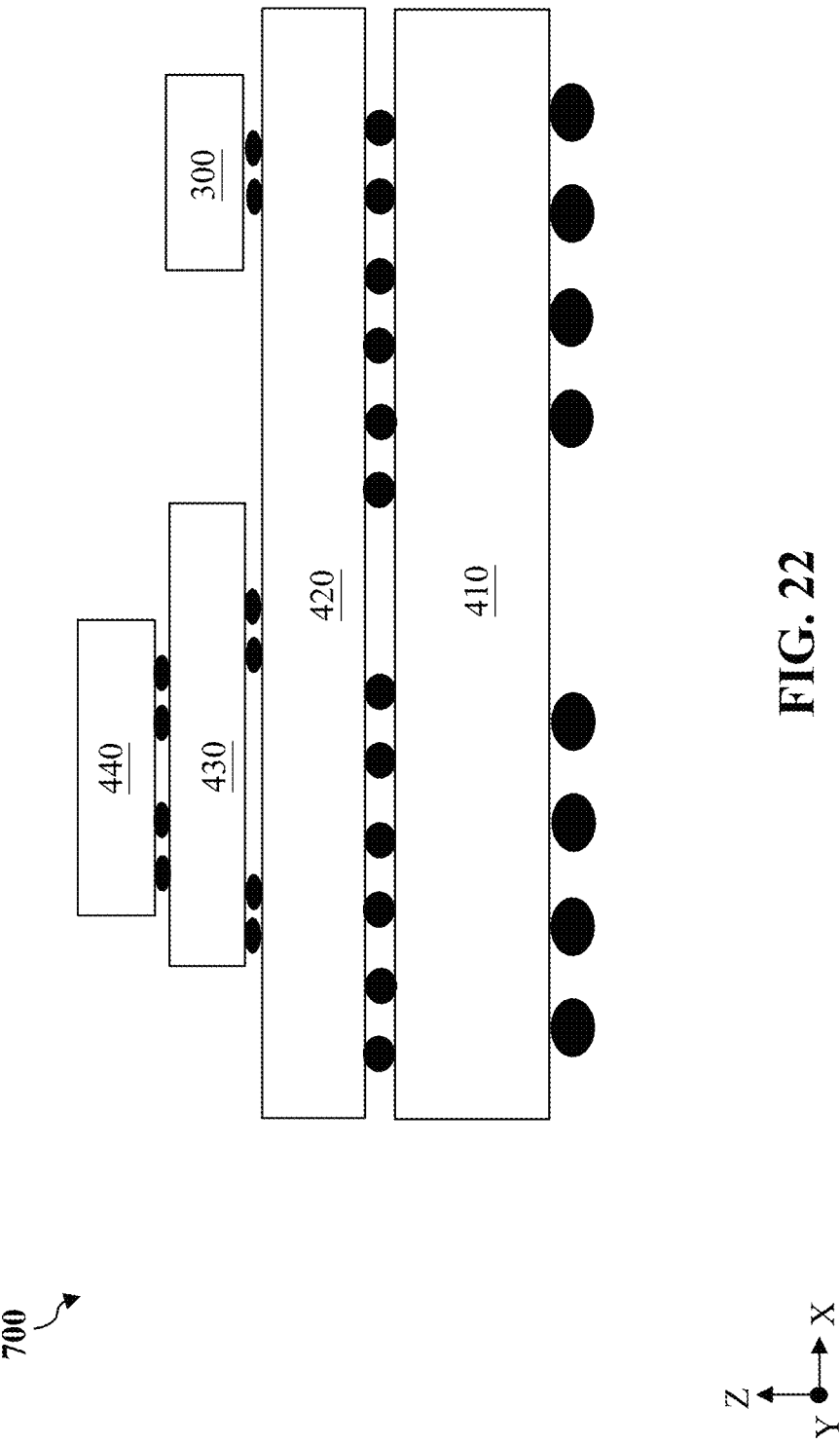

Other configurations of the package of the RF transceiver system 100 are also possible. For example, FIGS. 20-22 each illustrates a simplified configuration of the package of the RF transceiver system 100. FIG. 20 is a cross-sectional view of a package 500 of the RF transceiver system 100, according to various embodiments of the present disclosure. The package 500 of the RF transceiver system 100 in the present embodiments is a 2.5D integrated circuit (2.5DIC). In this present embodiment, the die 300, the first die 430, and the second die 440 are all electrically and mechanically coupled to the interposer 420. FIG. 21 is a cross-sectional view of a package 600 of the RF transceiver system 100, according to various embodiments of the present disclosure. The package 600 of the RF transceiver system 100 in the present embodiments is 3DIC. In this present embodiment, the die 300 is electrically and mechanically coupled to the interposer 420, the second die 440 is also electrically and mechanically coupled to the interposer 420. The second die 440 is disposed laterally adjacent to the die 300. The first die 430 is electrically and mechanically coupled to the die 300. In the present embodiments, the first die 430 is stacked over the die 300. FIG. 22 is a cross-sectional view of a package 700 of the RF transceiver system 100, according to various embodiments of the present disclosure. The package 700 of the RF transceiver system 100 in the present embodiments is 3DIC. In this present embodiment, the die 300 is electrically and mechanically coupled to the interposer 420, and the first die 430 is also electrically and mechanically coupled to the interposer 420. The first die 430 is disposed laterally adjacent to the die 300. The second die 440 is electrically and mechanically coupled to the first die 430. In the present embodiments, the second die 440 is stacked over the first die 430. It is understood that the packages represented in FIGS. 18-21 are just examples, and other suitable configurations are possible.

Although not intended to be limiting, one or more embodiments of the present disclosure provide many benefits to a semiconductor structure and the formation thereof. For example, the present disclosure provides III-V semiconductor devices and seal rings, and methods of forming the same. One or more III-V semiconductor layers (e.g., GaN) of the III-V semiconductor devices are spaced apart from the seal rings. That is, the seal ring is spaced apart from the one or more III-V semiconductor layers. Therefore, while bonding a die that includes the III-V semiconductor devices to another substrate (e.g., another die), although cracks may be formed due to, for example, thermal and/or mechanical stress, the cracks would not propagate into the III-V semiconductor devices, and improved reliability performance of the package is thus achieved.

The present disclosure provides for many different embodiments. Semiconductor structures and methods of fabrication thereof are disclosed herein. In one exemplary aspect, the present disclosure is directed to a semiconductor structure. The semiconductor structure includes a semiconductor substrate including a first region and a second region surrounding the first region, a III-V semiconductor layer disposed over the first region, a compound semiconductor device formed in and over the III-V semiconductor layer, a first plurality of conductive features disposed over and electrically coupled to a source contact of the compound semiconductor device, and a seal ring disposed over the second region and comprising a second plurality of conductive features. A top surface of a topmost conductive feature of the first plurality of conductive features is higher than a top surface of a topmost conductive feature of the second plurality of conductive features.

In some embodiments, the III-V semiconductor layer may include GaN, AlN, AlGaN, AlInGaN, or AlInN. In some embodiments, the semiconductor substrate may include silicon. In some embodiments, the seal ring may be disposed on the semiconductor substrate and spaced apart from a sidewall of the III-V semiconductor layer. In some embodiments, a height difference between the top surface of the topmost conductive feature of the first plurality of conductive features and the top surface of the topmost conductive feature of the second plurality of conductive features may be between about 1 um and about 10 um. In some embodiments, the semiconductor structure may also include a front-side through via extending through the III-V semiconductor layer and electrically coupled to the first plurality of conductive features. A top surface of the front-side through via may be higher than the top surface of the topmost conductive feature of the second plurality of conductive features. In some embodiments, the semiconductor structure may also include a back-side through via extending through the semiconductor substrate and in direct contact with the front-side through via. In some embodiments, the semiconductor structure may also include a passivation layer including a first portion disposed directly over the first region and a second portion disposed directly over the second region, a top surface of the first portion may be higher than a top surface of the second portion. In some embodiments, a bottommost conductive feature of the second plurality of conductive features may be spaced apart from the III-V semiconductor layer by the passivation layer. In some embodiments, a composition of a bottommost conductive feature of the second plurality of conductive features may be the same as a composition of the source contact.

In another exemplary aspect, the present disclosure is directed to a semiconductor structure. The semiconductor structure includes a first device region including a first compound semiconductor layer disposed over a substrate, and a first plurality of conductive features disposed over the first compound semiconductor layer, wherein the first plurality of conductive features comprise a first source contact disposed on the first compound semiconductor layer and a remaining portion of the first plurality of conductive features disposed over the first source contact. The semiconductor structure also includes a seal ring region surrounding the first device region and including a second plurality of conductive features. A bottommost conductive feature of the second plurality of conductive features is in direct contact with the substrate and spaced apart from a sidewall of the first compound semiconductor layer.

In some embodiments, the first device region may also include a via extending through the first compound semiconductor layer and disposed adjacent to the first plurality of conductive features. In some embodiments, a composition of the via may be the same as a composition of a topmost conductive feature of the first plurality of conductive features. In some embodiments, a top surface of the via may be higher than a top surface of a topmost conductive feature of the second plurality of conductive features. In some embodiments, the semiconductor structure may also include a second device region. The second device region may include a second compound semiconductor layer disposed over the substrate, and a third plurality of conductive features disposed over the second compound semiconductor layer, wherein the third plurality of conductive features comprise a second source contact disposed on the second compound semiconductor layer and a remaining portion of the third plurality of conductive features disposed over the second source contact. In some embodiments, the seal ring region is a first seal ring region, and the semiconductor structure may also include a second seal ring region spaced apart from the first seal ring region, and the second seal ring region may surround the second device region. In some embodiments, the seal ring region may also surround the second device region.

In yet another exemplary aspect, the present disclosure is directed to a method. The method includes providing a substrate comprising a first region surrounded by a second region, forming a III-V semiconductor layer on a top surface of the substrate and over the first region and second region, removing a portion of the III-V semiconductor layer formed directly over the second region, after the removing of the portion of the III-V semiconductor layer formed directly over the second region, forming a semiconductor device directly over the first region, and forming a seal ring directly over the second region, the seal ring comprising a plurality of conductive features, where a bottommost conductive feature of the plurality of conductive features is in direct contact with the top surface of the substrate.

In some embodiments, the method may also include forming a first through via penetrating through the III-V semiconductor layer and electrically connected to the semiconductor device, and forming a second through via penetrating through the substrate and electrically connected to the first through via. In some embodiments, the method may also include bonding the substrate to an interposer, wherein the interposer is underlying the semiconductor device, and bonding the interposer to a package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate comprising a first region surrounded by a second region;
forming a III-V semiconductor layer on a top surface of the substrate and over the first region and second region;
removing a portion of the III-V semiconductor layer formed directly over the second region;
after the removing of the portion of the III-V semiconductor layer formed directly over the second region, forming a semiconductor device directly over the first region; and
forming a seal ring directly over the second region, the seal ring comprising a plurality of conductive features, wherein a bottom surface of a bottommost conductive feature of the plurality of conductive features is coplanar with a bottom surface of the III-V semiconductor layer.

2. The method of claim 1, further comprising:
forming a first through via penetrating through the III-V semiconductor layer and electrically connected to the semiconductor device; and
forming a second through via penetrating through the substrate and electrically connected to the first through via.

3. The method of claim 2, wherein the first through via and the second through via are in physical contact.

4. The method of claim 2, wherein a top surface of the first through via is above a topmost surface of the plurality of conductive features of the seal ring.

5. The method of claim 1, further comprising:
bonding the substrate to an interposer, wherein the interposer is underlying the semiconductor device; and
bonding the interposer to a package substrate.

6. The method of claim 1, wherein the III-V semiconductor layer comprises gallium nitride (GaN).

7. A method, comprising:
forming a semiconductor device over a first region of a substrate;

forming an interconnect structure over and electrically coupled to the semiconductor device, the interconnect structure comprising a plurality of first conductive features; and
forming a seal ring providing protection for the semiconductor device and the interconnect structure, wherein the seal ring comprises a plurality of second conductive features, wherein a topmost conductive feature of the plurality of first conductive features and a topmost conductive feature of the plurality of second conductive features are formed simultaneously, and a topmost surface of the plurality of second conductive features is below a topmost surface of the plurality of first conductive features; and
forming a passivation layer over the seal ring and the interconnect structure.

8. The method of claim 7, wherein the semiconductor device is a III-V semiconductor device.

9. The method of claim 8, wherein the semiconductor device comprises a III-V semiconductor layer, and the seal ring is physically separated from the III-V semiconductor layer.

10. The method of claim 7, wherein the plurality of first conductive features are disposed in and over a dielectric structure.

11. The method of claim 10, further comprising:
forming a first via extending through the dielectric structure; and
forming a second via extending through the substrate to physically connect to the first via, wherein the second via is disposed under the first via.

12. The method of claim 11, wherein the first via is electrically coupled to the semiconductor device by way of the interconnect structure.

13. The method of claim 11, wherein the first via and one the topmost conductive feature of the plurality of first conductive features of the interconnect structure are formed simultaneously.

14. A method, comprising:
forming a semiconductor layer over a substrate, wherein the semiconductor layer and the substrate comprise different semiconductor materials;
patterning the semiconductor layer to remove a portion of the semiconductor layer over a first region of the substrate;
after the patterning of the semiconductor layer, forming a semiconductor device over the substrate;
forming an interconnect structure electrically coupled to the semiconductor device;
after the patterning of the semiconductor layer, forming a seal ring surrounding the patterned semiconductor layer and over the first region of the substrate, wherein the seal ring is physically separated from the patterned semiconductor layer and surrounds the semiconductor device and the interconnect structure.

15. The method of claim 14, wherein the patterned semiconductor layer is a portion of the semiconductor device.

16. The method of claim 14, wherein the semiconductor device comprises a high electron mobility transistor (HEMT), and the patterned semiconductor layer comprises a III-V semiconductor material.

17. The method of claim 14, wherein the interconnect structure and the seal ring are formed simultaneously.

18. The method of claim 17, wherein a topmost surface of the conductive features of the interconnect structure is above a topmost surface of the seal ring.

19. The method of claim 17, further comprising:
   forming a first via extending through the patterned semiconductor layer and electrically coupled to the semiconductor device; and
   forming a second via extending through the substrate and electrically coupled to the first via.

20. The method of claim 19, wherein the forming of the first via comprises:
   forming a trench extending through the patterned semiconductor layer and a dielectric structure of the interconnect structure over the patterned semiconductor layer; and
   forming a conductive feature in the trench, thereby forming the first via, wherein the first via and one of the conductive features of the interconnect structure are formed simultaneously.

\* \* \* \* \*